United States Patent [19]
Nitta et al.

[11] Patent Number: 6,031,860
[45] Date of Patent: Feb. 29, 2000

[54] OPTICAL DEVICE CAPABLE OF SWITCHING OUTPUT INTENSITY OF LIGHT OF PREDETERMINED POLARIZED WAVE, OPTICAL TRANSMITTER USING THE DEVICE, NETWORK USING THE TRANSMITTER, AND METHOD OF DRIVING OPTICAL DEVICE

[75] Inventors: Jun Nitta, Ninomiya-machi; Mamoru Uchida, Yokohama, both of Japan

[73] Assignee: Canon Kabushiki Kaisha, Tokyo, Japan

[21] Appl. No.: 08/915,664

[22] Filed: Aug. 21, 1997

[30] Foreign Application Priority Data

| Aug. 22, 1996 | [JP] | Japan | 8-239801 |
| Sep. 9, 1996 | [JP] | Japan | 8-260307 |
| Aug. 5, 1997 | [JP] | Japan | 9-223079 |

[51] Int. Cl.[7] .................................................. H01S 3/085
[52] U.S. Cl. ........................ 372/50; 372/27; 372/97; 372/102
[58] Field of Search ........................ 372/27, 26, 50, 372/97, 92, 102

[56] References Cited

U.S. PATENT DOCUMENTS

| 4,920,542 | 4/1990 | Brosson et al. ........................ 372/50 |
| 5,202,782 | 4/1993 | Nakamura et al. .................... 359/152 |
| 5,249,244 | 9/1993 | Uchida ................................. 385/15 |
| 5,440,581 | 8/1995 | Ono et al. ............................ 372/96 |
| 5,521,754 | 5/1996 | Nitta et al. .......................... 359/344 |
| 5,590,145 | 12/1996 | Nitta .................................. 372/50 |
| 5,608,572 | 3/1997 | Nitta et al. .......................... 359/344 |
| 5,901,166 | 5/1999 | Nitta et al. .......................... 372/50 |

FOREIGN PATENT DOCUMENTS

| 0620475 | 10/1994 | European Pat. Off. ........ G02F 1/313 |
| 0668641 | 8/1995 | European Pat. Off. ........ H01S 3/103 |
| 0673127 | 9/1995 | European Pat. Off. ...... H04B 10/135 |
| 0674372 | 9/1995 | European Pat. Off. .......... H01S 3/19 |
| 0721240 | 7/1996 | European Pat. Off. ........ H01S 1/103 |
| 62-42593 | 2/1987 | Japan . |
| 62-144426 | 6/1987 | Japan . |
| 63299291 | 12/1988 | Japan ................................ H01S 3/18 |
| 2-159781 | 6/1990 | Japan . |
| 6-265958 | 9/1994 | Japan . |
| 7-202343 | 8/1995 | Japan . |

OTHER PUBLICATIONS

M.C. Wu et al., "Wavelength Tuning and Switching of a Coupled Distributed Feedback and Fabry Perot Laser", Journal of Applied Physics, vol. 63, No. 2 (Jan.1988).

*Primary Examiner*—James W. Davie
*Attorney, Agent, or Firm*—Fitzpatrick, Cella Harper & Scinto

[57] ABSTRACT

In an optical device having a diffraction grating and at least two surfaces for reflecting light, the oscillation state is switched between a first oscillation state mainly based on resonance by distributed reflection by the diffraction grating, and a second oscillation state mainly based on Fabry-Pérot resonance between the two surfaces. The characteristics of one of two modes to be used are improved at the cost of coherence of the other mode.

40 Claims, 15 Drawing Sheets

OPTICAL DEVICE CAPABLE OF SWITCHING OUTPUT INTENSITY OF LIGHT OF PREDETERMINED POLARIZED WAVE, OPTICAL TRANSMITTER USING THE DEVICE, NETWORK USING THE TRANSMITTER, AND METHOD OF DRIVING OPTICAL DEVICE

BACKGROUND OF THE INVENTION

1. Field of the Invention

The present invention relates to an optical device and, more particularly, to a laser. The present invention also relates to an optical transmitter using the optical device and a network using the optical transmitter. Furthermore, the present invention relates to a method of driving the optical device.

2. Related Background Art

As the optical communication techniques have evolved to realize larger capacities, many problems have been solved. However, so-called chirping, i.e., a phenomenon in which refractive index drifts caused by a nonuniform carrier distribution in a semiconductor laser upon high-speed intensity modulation distort the oscillation waveform, remains unsolved. In a popular method currently used for avoiding this problem, a semiconductor laser is driven continuously by coupled waves (CW), and intensity modulation is made by an external modulator consisting of a dielectric, semiconductor, and the like. With this method, a size reduction and a cost reduction of the device are limited, and when such device is used in an optical network, the flexibility (e.g., the capability of transferring signals having considerably different modulation speeds at the same time) of the optical network is not so high.

On the other hand, as another method, a method of switching the plane of polarization of oscillation light of a device in correspondence with a signal, i.e., a so-called polarized wave modulation method, is available. This method is disclosed in, e.g., Japanese Patent Laid-Open Application Nos. 62-42593 and 62-144426. The essence of this method is as follows. As shown in FIG. 12, a semiconductor laser with characteristics in which an input TM mode is converted into an output TE mode at a given current value is used. A specific current value at which TE and TM modes oscillate simultaneously is defined as a bias point, the threshold value gain of the TE and TM modes is switched by a signal current (modulated current) $I_S$, and only light polarized in a specific direction is output onto a transmission path using a polarizer.

The polarized wave modulation method has the following essential advantage. That is, since the optical density of a semiconductor laser is constant even during modulation (since the driving current is always nearly constant and is not turned on/off), carrier drifts caused by modulation can be minimized.

However, the above-mentioned prior arts do not describe any detailed structures of such laser.

On the other hand, as an example of the arrangement, the following two-electrode arrangement is available.

(1) A conventional DFB laser is taken to have a two-electrode arrangement, and carriers are nonuniformly injected to simultaneously control the phase and gain.

(2) The active layer adopts a quantum well structure to have polarized wave dependence of the gain, thus compensating for shortage of the gain of TM modes.

(3) The TE and TM modes at the Bragg wavelength are switched by phase control to attain direct polarized wave modulation.

A laser that can switch the polarized wave of output light is also disclosed in Japanese Patent Application Laid-Open No. 2-159781.

SUMMARY OF THE INVENTION

The present invention proposes an optical device with a novel arrangement. Especially, the present invention proposes an optical device suitable for modulating the output intensity of light of a given polarized wave.

One of optical devices according the present invention is as follows.

An optical device comprises:

a compound resonator structure having a first resonator structure which produces resonance by reflecting light using a diffraction grating, and a second resonator structure which produces Fabry-Pérot resonance by reflecting light using at least two surfaces, wherein an output intensity of light of a predetermined polarized wave in a first oscillation state mainly based on the resonance by the first resonator structure is different from an output intensity of light of the predetermined polarized wave in a second oscillation state mainly based on the resonance by the second resonator structure.

In the compound resonator having at least two resonator structures, a first oscillation state based on resonance mainly by the first resonator structure, and a second oscillation state based on resonance mainly by the second resonator structure can be switched. More specifically, by switching the degrees of contribution of the first and second resonator structures to oscillation in the compound resonator structure, the resonator structure, the resonance of which mainly contributes to oscillation can be selected. For example, from a state (first oscillation state) wherein light is distributed and reflected by a diffraction grating to produce resonance at or in the neighborhood of the Bragg wavelength of the diffraction grating, and oscillation is mainly produced by the resonance, when the degree of contribution to the oscillation by the distributed reflection at the diffraction grating is relatively decreased, and the degree of contribution to the oscillation by Fabry-Pérot resonance by two surfaces is relatively increased, the oscillation state can be switched to a state (second oscillation state) wherein the oscillation is produced mainly by the Fabry-Pérot resonance. In this case, the output intensity of light of a predetermined polarized wave in the first oscillation state is set to be different from that of light of the predetermined polarized wave in the second oscillation state. For the light of the predetermined polarized wave, the intensity of light can be switched by selecting whether this optical device is set in the first or second oscillation state. Especially, by setting the polarized wave of light mainly output in the first oscillation state to be different from that of light mainly output in the second oscillation state, the intensity of the output light can be largely changed for one polarized wave. More specifically, for example, TM light is mainly output in one of the first and second oscillation states, and TE light is mainly output in the other state.

It is important that the first and second oscillation states have different output intensities for the light of the predetermined polarized wave. For example, for the light of the predetermined polarized wave, strong oscillation, a DFB or DBR mode is excited in the first oscillation state, while weak oscillation (e.g., a Fabry-Pérot mode or a mixed mode of a Fabry-Pérot mode and a DFB or DBR mode) is excited in the second oscillation state.

A first region including the first resonator structure and a second region including the second resonator structure may be serially formed or may at least partially overlap each other, or the optical device may have a structure or region for coupling the first and second regions.

The optical device may comprise control means for switching an oscillation state between the first and second oscillation states, control means for applying electrical control for switching an oscillation state between the first and second oscillation states, an electrode for applying electrical control for switching an oscillation state between the first and second oscillation states, an electrode for switching an oscillation state between the first and second oscillation states by controlling a carrier density to be injected, or an electrode for switching an oscillation state between the first and second oscillation states by controlling an electric field to be applied.

The optical device may comprise a phase adjusting region for adjusting a phase of light in the optical device. By adjusting the phase, the first and second oscillation states can be switched. The optical device may comprise a phase adjusting region for adjusting a phase of light in the optical device independently of a first region including the first resonator structure and a second region including the second resonator structure.

The optical device of the present invention can be formed by stacking semiconductor layers. In this case, the diffraction grating may be formed on an interface between two semiconductor layers.

The diffraction grating may be formed on an interface between two semiconductor layers, and the optical device may further comprise means for adjusting a refractive index of at least one of the two semiconductor layers; the diffraction grating may be formed on an interface between two semiconductor layers, and at least one of the two semiconductor layers may include a quantum well structure; the diffraction grating may be formed on an interface between two semiconductor layers, and the optical device may further comprise control means for applying electrical control for adjusting a refractive index of at least one of the two semiconductor layers; the diffraction grating may be formed on an interface between two semiconductor layers, and the optical device may further comprise an electrode for applying electrical control for adjusting a refractive index of at least one of the two semiconductor layers; or the diffraction grating may be formed on an interface between two semiconductor layers, and the optical device may further comprise an electrode for applying an electrical field for adjusting a refractive index of at least one of the two semiconductor layers.

The optical device may comprise a gain medium for producing a gain in the optical device. The optical device of the present invention need only be formed by stacking semiconductor layers, and in order to produce gain, an active layer containing a gain medium need only be formed.

The optical device may comprise an active layer including a gain medium for producing a gain in the optical device, the active layer including a quantum well structure, and the active layer may include a plurality of quantum well structures. The plurality of quantum well structures may be at least partially different from each other to build an asymmetric quantum well structure. By adopting an asymmetrical quantum well structure, the gain spectrum distribution can be efficiently controlled by controlling the carrier density to be injected.

On the other hand, a strain stress may be applied on at least one of layers that build the quantum well structure. The strain stress is mainly determined by the lattice constants of the individual layers. By applying the strain stress, a desired gain spectrum can be efficiently obtained.

The optical device may comprise a gain medium for producing a gain in the optical device, and a Bragg wavelength of the diffraction grating may be set in the vicinity of peak energy of the gain medium.

The optical device may comprise an electrode for independently injecting carriers into a first region including the first resonator structure and a second region including the second resonator structure.

An axial mode spacing of the Fabry-Pérot resonance may be set to be sufficiently smaller than a stop band based on the resonance by the diffraction grating in a region including the diffraction grating. With this setting, the first and second oscillation states can be switched more efficiently and more reliably.

The optical device may comprise means for controlling a degree of optical coupling between the first and second resonator structures, or a region for controlling a degree of optical coupling between the first and second resonator structures.

The diffraction grating may have a phase discontinuous portion.

The optical device may comprise a region where the diffraction grating is not formed. Especially, in the arrangement for switching the first and second oscillation states by controlling the coupling coefficient of the diffraction grating, the region where no diffraction grating is formed is arranged to prevent the degree of resonance by the diffraction grating from excessively increasing in advance.

One of optical devices of the present invention is as follows.

An optical device comprises:

a compound resonator structure having a first resonator structure which produces resonance by reflecting light using a diffraction grating, and a second resonator structure which produces Fabry-Pérot resonance by reflecting light using at least two surfaces; and means for switching an oscillation state between a first oscillation state mainly based on the resonance by the first resonator structure and a second oscillation state mainly based on the resonance by the second resonator structure.

One of optical devices of the present invention is as follows.

An optical device comprises:

a compound resonator structure having a first resonator structure which produces resonance by reflecting light using a diffraction grating, and a second resonator structure which produces Fabry-Pérot resonance by reflecting light using at least two surfaces; and an electrode for applying electrical control for switching an oscillation state between a first oscillation state mainly based on the resonance by the first resonator structure and a second oscillation state mainly based on the resonance by the second resonator structure.

One of optical devices of the present invention is as follows.

An optical device comprises:

a resonator structure for producing resonance by reflecting light using a diffraction grating; and control means for controlling a coupling coefficient of the diffraction grating.

In this optical device, the coupling coefficient of the diffraction grating can be controlled by the control means. When the coupling coefficient is sufficiently large, oscillation is due mainly to resonance by the diffraction grating; when the coupling coefficient becomes small, oscillation is supported by Fabry-Pérot resonance between the two end faces of this optical device.

One of optical devices of the present invention is as follows.

An optical device comprises:
   a resonator structure for producing resonance by reflecting light using a diffraction grating; and
   control means for controlling a coupling coefficient of the diffraction grating by controlling a refractive index of at least one of two semiconductor layers, on an interface of which the diffraction grating is formed.

An optical device comprises:
   a resonator structure for producing resonance by reflecting light using a diffraction grating; and
   an electrode for applying electrical control for controlling a coupling coefficient of the diffraction grating by controlling a refractive index of at least one of two semiconductor layers, on an interface of which the diffraction grating is formed.

An optical transmitter can be constituted using each of the above-mentioned optical devices. In this case, a polarized wave selector for extracting the light of the predetermined polarized wave from the output light of the optical device is preferably formed. As the polarized wave selector, a polarizer can be used. In this optical transmitter, by switching the first and second oscillation states, the intensity of light extracted by the polarized wave selector is switched. Hence, by switching the first and second oscillation states in correspondence with the signal to be transmitted, an intensity-modulated optical signal can be obtained.

Furthermore, a network for transmitting an optical signal can be built using the optical transmitter.

One of methods of driving an optical device according to the present invention is as follows.

A method of driving an optical device having a diffraction grating and at least two surfaces for reflecting light, comprises the step of:
   switching an oscillation state between a first oscillation state to which resonance by reflection of light by the diffraction grating greatly contributes, and a second oscillation state in which a degree of contribution of the resonance by the reflection of light by the diffraction grating is smaller than the first oscillation state.

In this method, switching between the first and second oscillation states may be attained by adjusting a phase of light in the optical device. For example, when the phase is controlled so that the phase of light oscillated in the first oscillation state becomes closer to a state that satisfies a resonance condition, the first oscillation state is obtained; when the phase of light in the optical device is changed to a state wherein the phase of light oscillated in the first oscillation state is separated away from the state that satisfies the resonance condition, and light to be oscillated in the second oscillation state oscillates more easily, the second oscillation state is obtained.

Also, switching between the first and second oscillation states may be attained by controlling a coupling coefficient of the diffraction grating.

DETAILED DESCRIPTION OF THE PREFERRED EMBODIMENTS

Figure 1:
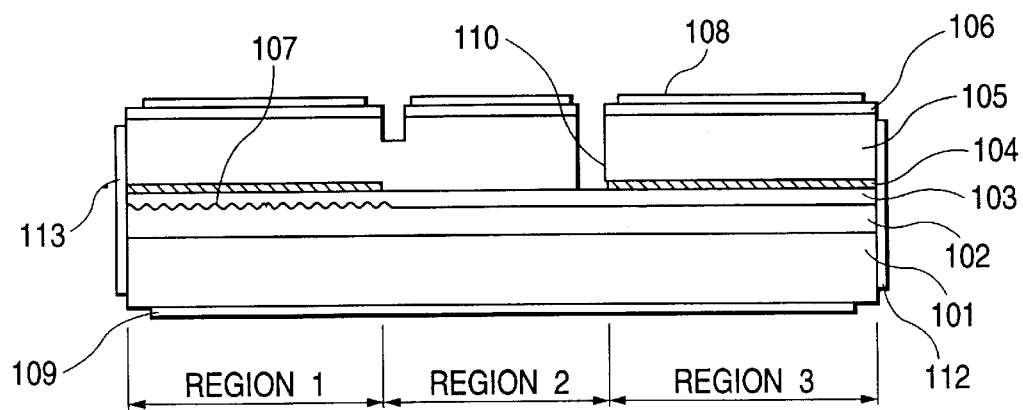
FIG. 1 is a sectional view of the first embodiment taken along the resonator direction.

The preferred embodiments of the present invention will be described hereinafter.

The present inventors found that a light source that can be polarized-wave modulated need not set both TM and TE modes of oscillated light in a low chirp state, but can use one of these modes as a signal.

Hence, each of the following embodiments aims at improving controllability and reliability of switching at the cost of coherence (single axial mode characteristics) of one mode.

The basic arrangement in the first to fourth embodiments is as follows.

1) A compound resonator made up of a region having a Fabry-Pérot resonator (FP), a region having a DFB, and a phase adjusting region is adopted.

2) The resonator loss spectrum is controlled by optimizing or varying the coupling coefficients of a plurality of waveguides that form the compound resonator.

3) Light components having different directions of polarization are selectively oscillated by changing the effective resonator length by, e.g., applying a signal current or signal voltage to the phase adjusting region.

More specifically, the following arrangement may be used.

4) The fact that in a conventional slab waveguide the resonator loss of TE light is always smaller than that of TM light in the FP is used. The converse is also true.

5) The grating pitch of the DFB region is set so that the Bragg wavelength matches the gain peak wavelength, thereby controlling the gain and resonator loss spectrum so that the DFB mode is selected as the TM mode. At the same time, the axial mode spacing of the resonator mode of the FP is set to be smaller than the stop band of the DFB, thereby controlling the gain and resonator loss spectrum, so that one or both of the FP and DFB modes are simultaneously selected as the TE mode.

6) Conversely, the gain and resonator loss spectrum are controlled so that the DFB mode is selected as the TE mode and one or both of the FP and DFB modes are simultaneously selected as the TM mode.

7) An asymmetric (strained) quantum well structure is used in an active layer to give polarized wave dependence to the gain spectrum.

The oscillation wavelength of a semiconductor laser is determined by the following oscillation conditional formula:

$$\Gamma \cdot g_{th} = \Gamma \cdot \alpha_{in} + \alpha_M + \alpha_{sc} \quad (1)$$

for $\alpha_M = \frac{1}{2} L_{eff} \cdot ln(1/R_1 \cdot 1/R_2)$ $$\exp(i \cdot (2n_{eff} L_{eff}/\lambda + \phi)) = 0 \quad (2)$$

where $\Gamma$: optical confinement coefficient in active layer $g_{th}$: threshold gain $\alpha_{in}$: internal loss $\alpha_M$: reflection loss $\alpha_{sc}$: other losses (scattering loss, coupling loss, and the like)

$R_i$: effective reflectance in two directions viewed from one point in resonator $n_{eff}$: effective refractive index of waveguide $L_{eff}$: effective resonator length $\lambda$: oscillation wavelength $\phi$: phase In addition, a directly polarized wave modulation semiconductor laser is required to have, as another condition, independent polarized wave modes, e.g., TE and TM modes, and their threshold gains must be nearly equal to each other. That is, $$\Gamma_{TE} \cdot g_{thTE} = \Gamma_{TM} \cdot g_{thTM} \quad (3)$$

Since the individual variables have wavelength dependence and polarized wave dependence, it is not easy to simultaneously satisfy all the above conditions (1) to (3). Especially, equation (2) is a very important conditional formula that determines the oscillation mode (wavelength, polarized wave mode, transverse mode). In the conventional resonator arrangement based on the DFB, since the oscillation wavelength is discrete relative to the gain spectrum between the TE and TM modes as oscillation modes, it is hard to satisfy equations (2) and (3) at the same time.

In the case of a compound resonator laser consisting of a compound resonator including the FP and DFB, and a slab waveguide, the reflectance and its loss spectrum viewed from an arbitrary one point in the resonator can be greatly changed by the coupling parameters (the coupling coefficient and phase between waveguides) of the resonator. Furthermore, by using the resonator distribution and polarized wave dependence of the gain, the threshold gains of TE and TM modes at the Bragg wavelength can be made nearly equal to each other. When a phase adjusting region is formed to modulate the phase, a situation in which the threshold value of, e.g., TM polarized light with respect to the DFB mode is lowered by feedback from another reflection end (e.g., the Fabry-Pérot resonator), and the DFB mode is stably oscillated as TM polarized light, and a situation in which the threshold value of the DFB mode as TE polarized light is raised by feedback from another reflection end (e.g., the DFB resonator), and the DFB and Fabry-Pérot modes (multimode) are oscillated as TE polarized light can be switched. As described above, the most characteristic portion of the present invention is that the phase matching condition between TE and TM can be satisfied more easily than the conventional arrangement.

The polarized wave dependence of the gain will be described in detail below. An asymmetric quantum well structure has a certain degree of freedom in varying the band gap and profile as compared to a symmetric quantum well structure. Furthermore, when a strain is asymmetrically introduced, the band gap can be selectively varied for the TE and TM modes. This means that the gain in a single active layer at a single injection carrier density can be set at the individual threshold gains of the TE and TM modes. The threshold carrier density is set at a modulation bias point, and a signal is superposed on an injection current or the injection current is phase-modulated to obtain a polarized wave-switched optical output.

First Embodiment

FIG. 1 is a sectional view of the first embodiment of the present invention taken along the resonator direction. The detailed layer structure is as follows. In FIG. 1, an optical device has an n-InP substrate 101, an n-InP cladding layer 102, an n-InGaAsP light guide layer 103, an undoped GaInAsP active layer 104, a p-InP cladding layer 105, and a p-InGaAsP contact (capping) layer 106. Also, the optical device has a grating 107 having a λ/4 phase shift portion and formed between the n-cladding layer 102 and the n-light guide layer 103, a positive electrode 108, and a negative electrode 109.

In FIG. 1, region 1 corresponds to a DFB region, region 2 corresponds to a phase adjusting region, and region 3 corresponds to a Fabry-Pérot resonator (FP) region. A coupling parameter κ·L of the DFB region is about 2, and the resonator length of the FP region is set at 300 μm, thereby setting the axial mode spacing of the FP mode to be sufficiently smaller than the stop band. The individual regions are electrically independent from each other, but are optically coupled via the light guide layer 103 aligned in the resonator direction. In the DFB region, the grating 107 is formed on the light guide layer 103, and its grating pitch is set so that the Bragg wavelength of the TM mode agrees with the gain peak.

In the FP region, the two end faces form a Fabry-Pérot resonator. In this embodiment, one end face uses a cleavage surface 112, and the other end face 110 uses an etching surface (etching mirror) 110. The depth of the etching surface 110 reaches the active layer 104 in this embodiment.

As a result, the FP region can have both the functions of a reflecting mirror and an optical coupler. There is no gain medium in the phase adjusting region, the two end faces of which are obliquely cut not to form a resonator. An end face 113 of the DFB region and the end face 112 of the FP region may be coated as needed. In this embodiment, an anti-reflection (AR) coat 113 is formed on the DFB side, and a 50% reflecting coat 112 is formed the FP side.

Figure 3A:
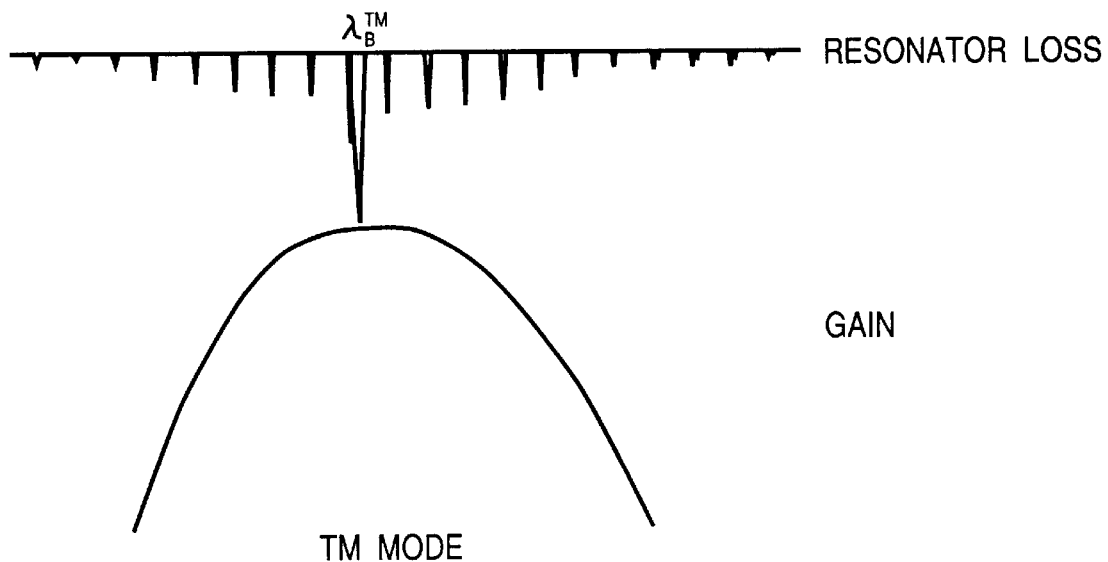
FIGS. 3A and 3B are graphs for explaining the relationship between the gain spectrum and resonator loss spectrum of the first embodiment in correspondence with TM and TE modes.
Figure 3B:
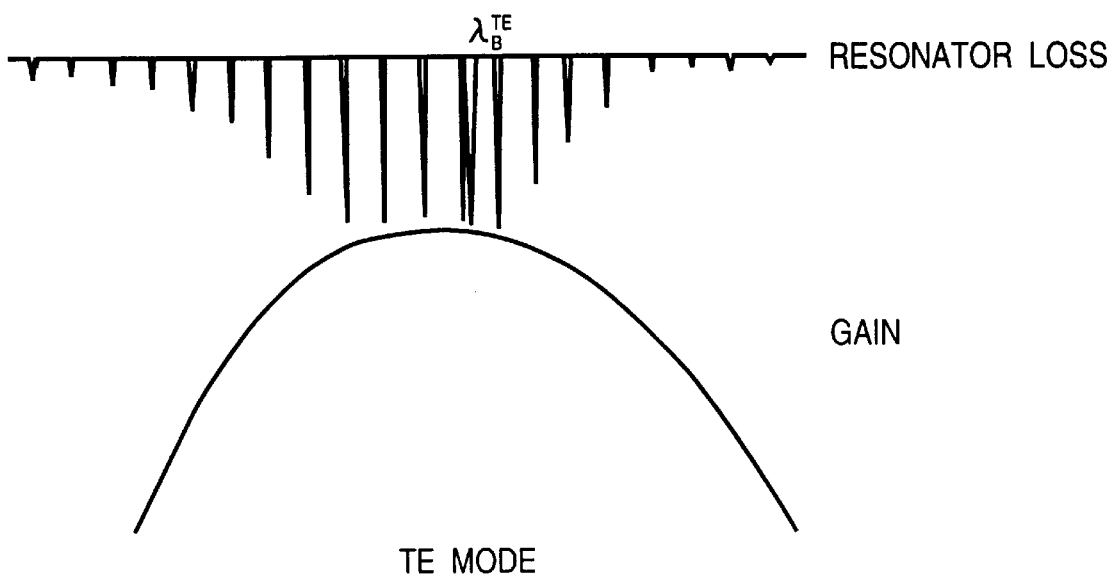

The operation principle of this embodiment will be described below. FIGS. 3A and 3B show the gain spectra and resonator losses of the individual polarized waves (TE and TM) (the abscissa plots the wavelength, and the ordinate plots the gain or loss). In an actual device, the graphs in FIGS. 3A and 3B overlap each other, and the oscillated mode has a resonator loss lower than the gain. Assuming that the gain has an identical spectrum distribution (e.g., in the case of a bulk active layer) independently of the polarized light state for the sake of simplicity, whether or not the laser oscillates is determined by the resonator loss alone. In the case of this embodiment, it is important to adjust the phase of light which leaves region 1 (distributed feedback semiconductor laser), is reflected by region 3, and returns to region 1, by changing the refractive index of region 2.

In general, a waveguide has different equivalent refractive indices with respect to TE polarized light and TM polarized light. In this embodiment, the equivalent refractive index with respect to TE polarized light takes on a value about 0.2% larger than that with respect to TM polarized light. Hence, even if the physical distance to the reflecting surface remains the same, and TE polarized light and TM polarized light are in phase at the interface between regions 1 and 2, the distance (optical distance) the light actually traverses differs due to different equivalent refractive indices, and the returning light components have different phases. Also, the amounts of change in refractive index for each polarized light differ when the refractive index of region 2 is changed by a plasma effect. In the case of a semiconductor laser, the threshold value changes depending on the phase of reflected light. For example, if the phase of the reflected light is different by a half wavelength from that of exit light, these light components cancel each other if they have an equal intensity, and exhibit an effect of increasing the threshold value. On the other hand, if these light components are in phase, they resonate, and decrease the threshold value. A Fabry-Pérot laser oscillates at a wavelength at which the phase condition for resonance is satisfied by feedback from another reflecting end (e.g., a DFB resonator).

In the case of a distributed feedback semiconductor laser, since the wavelength with a low resonator loss is determined by the diffraction grating, the threshold value of the DFB mode can be changed by light returning from another reflecting end (e.g., a Fabry-Pérot resonator). On the other hand, since region 3 that builds the Fabry-Pérot laser amplifies the DFB mode and consumes the gain when light from the distributed feedback semiconductor laser is intense, oscillation is suppressed. At this time, if the DFB mode becomes weak, the gain consumption amount in region 3 decreases to increase the gain of the Fabry-Pérot mode. In this case, if light is sufficiently excited, oscillation of the FP mode starts. In the present invention, upon switching from the DFB mode to the FP mode, the polarized light mode oscillated by the distributed feedback semiconductor laser is switched (e.g., polarized light is switched from TM polarized light to TE polarized light). In this manner, the resonator mode can be switched between the DFB mode as TM polarized light and the mixed mode of the FP and DFB modes as TE polarized light.

Hence, by controlling the carrier injection amount of each region, not only the threshold gains of the two modes can be set to be equal to each other, but also the resonator mode can be switched between a stable TM mode and a TE multimode. Whether the entire LD oscillates in the TE mode or TM mode is determined by the phase condition. In the phase adjusting region, the effective refractive index is changed by a plasma effect by injecting carriers.

Figure 4:
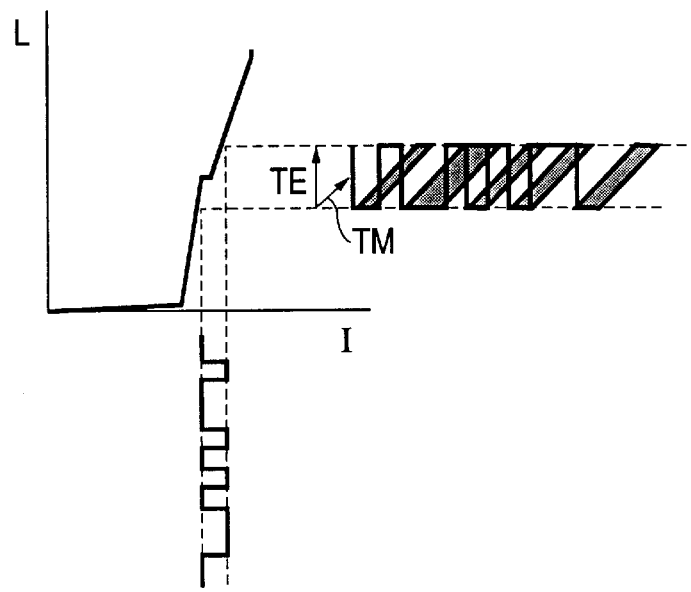
FIG. 4 is a graph showing the modulation characteristics of an embodiment of the present invention.

FIG. 4 shows the current (I) vs. light output (L) characteristics when a very weak signal current is superposed using the carrier injection amount as a modulation bias. As compared to the prior art, the TE and TM modes can be switched by a small change in current, thus providing a great practical advantage. As a result, the total light output remains unchanged during modulation, and the influence of chirping is hardly observed. Statically, both TE and TM modes are single axial modes. Upon high-speed modulation, the TE mode becomes a multimode, but in the TM mode, a single axial mode maintains low chirp. When a polarizer is inserted in front of the exit end face to select TM light alone, a low-chirp optical signal can be output.

In this embodiment, the DFB mode as the TM mode and FP/DFB multimode as the TE mode have been exemplified, but the converse is also true. For example, using the polarized wave dependence of the end face coating reflectance, a region where the reflectance of TM light is higher than that of TE light can be formed in a slab waveguide. In this case, the grating pitch is set, so that the Bragg wavelength of the TE mode agrees with the gain peak.

Second Embodiment

Figure 2:
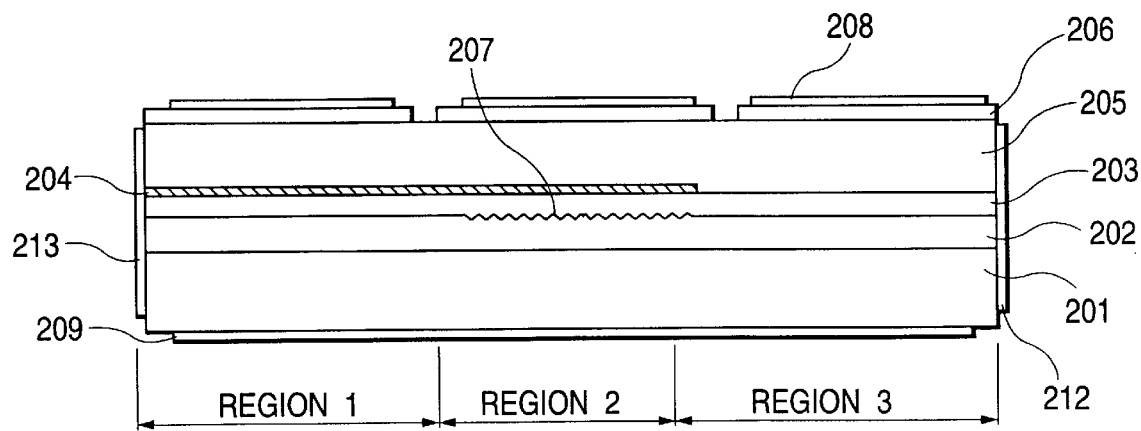
FIG. 2 is a sectional view of the second embodiment taken along the resonator direction.

FIG. 2 shows an optical device that can achieve the same operation and effect as those of the first embodiment by a different arrangement. In FIG. 2, region 1 corresponds to a gain region, region 2 corresponds to a DFB region, and region 3 corresponds to a phase adjusting region. End faces 212 and 213 form a Fabry-Pérot resonator, and a grating 207 forms a second resonator. The optical device shown in FIG. 2 has an n-InP substrate 201, an n-InP cladding layer 202, an n-InGaAsP light guide layer 203, an undoped GaInAsP active layer 204, a p-InP cladding layer 205, and a p-InGaAsP contact layer 206. Also, the optical device has a grating 207 having a $\lambda/4$ phase shift portion and formed at the boundary between the n-cladding layer 202 and the n-light guide layer 203, a positive electrode 208, and a negative electrode 209.

In this embodiment, although the manufacture is facilitated, since the coupling coefficient of waveguides reaches nearly 100%, the loads on other parameters (a coupling parameter $\kappa \cdot L$ of the DFB region, and the like) may become heavier. In this embodiment, a means for coupling a plurality of waveguides is realized by forming a common light guide layer. The operation principle of the device is substantially the same as that described above with the aid of FIGS. 3A, 3B and 4 in the first embodiment.

Third Embodiment

The characteristics can be further improved by controlling the profile of a gain g in conditional formulas (2) and (3). An embodiment that exploits the polarized wave dependence of the gain will be explained below.

In general, when a quantum well is strained, degeneracy of the valence band diminishes, and a nature considerably different from that of an unstrained system appears. For example, in a normal quantum well, the gain of TE modes is slightly larger than that of TM modes. When a compression strain is applied, this tendency becomes more pronounced; when a tensile strain is applied, the gain of TM modes can become larger than that of TE modes. That is, the polarized wave dependence can be controlled. At the same time, it is generally accepted that since the differential gain (the ratio of the carrier change amount to the gain change amount) can be increased, a decrease in threshold value, improvement of the modulation limit frequency, and the like can be attained.

Figure 5:
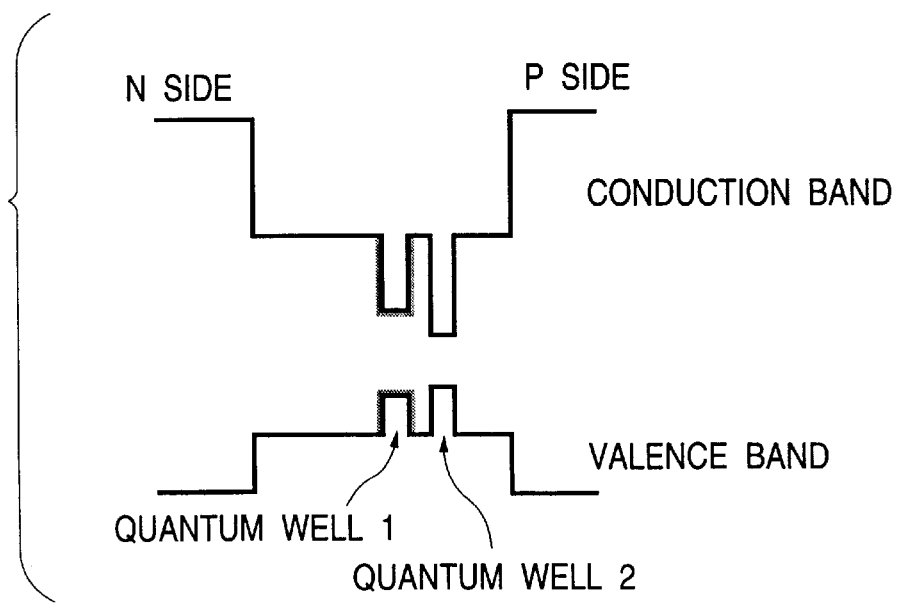
FIG. 5 is a band diagram of an asymmetrical strained quantum well.

FIG. 5 shows the band structure of the active layer. The peak wavelengths of photoluminescences of quantum well 1 and quantum well 2 (a quantum well layer on the low energy side, which contributes to the gain of TE modes) are respectively set at 1.550 $\mu$m and 1.565 $\mu$m. A strain of 2.0% (tensile strain) is introduced into quantum well 1 alone (which is a quantum well layer on the high energy side, and contributes to the gain of TM modes). In this embodiment, the active layer 104 or 204 in the first or second embodiment is replaced by an active layer with this band structure. The grating pitch of the DFB region is set so that at least one of the Bragg wavelengths of two guided modes is set in the vicinity of the gain spectrum peak wavelength of the asymmetrical quantum well.

Figure 6:
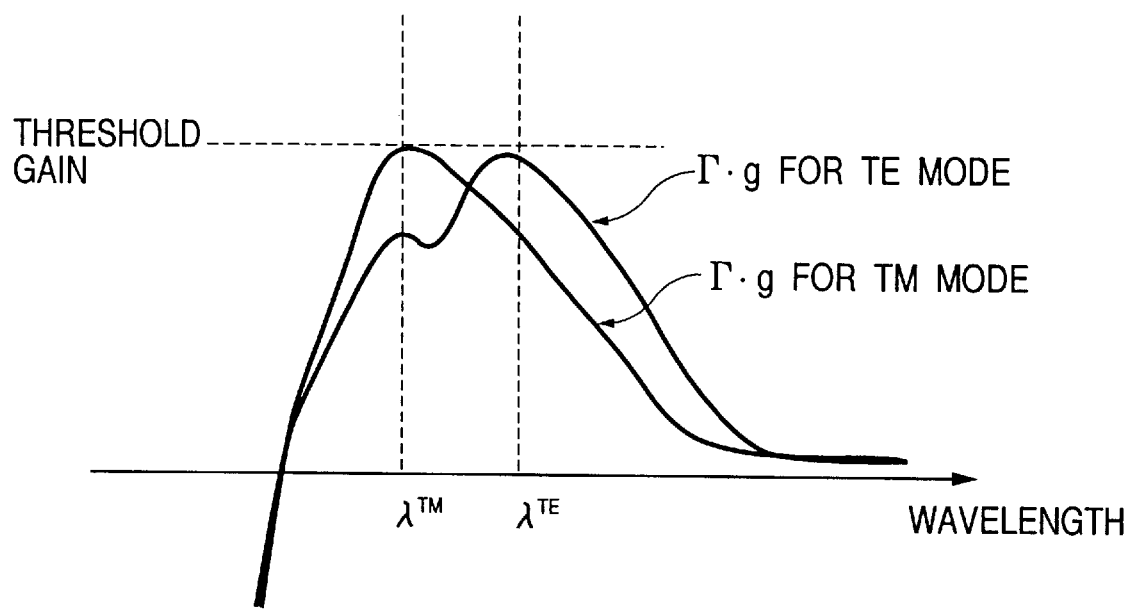
FIG. 6 is a graph for explaining the gain spectra of the asymmetrical strained quantum well in correspondence with TM and TE modes.

As a result, the gain increases by carrier injection, but the gain profile (gain spectrum) has large carrier density dependence unlike the gain of a normal bulk crystal or quantum well layer. FIG. 6 shows the gain spectrum of $\lambda$·g at a certain carrier density (injection current). The differences from the first and second embodiments are that the threshold carrier density (threshold gain) lowers (due to change in pattern of the energy band structure in a k space), modulation efficiency is improved (polarized wave modulation can be achieved with a smaller change in current or voltage or the like, since the effective mass becomes small, and carriers become easier to move), the polarized wave dependence of the gain spectrum can be increased and the gain peak wavelength of TE and TM modes can be varied, and so on.

Figure 7A:
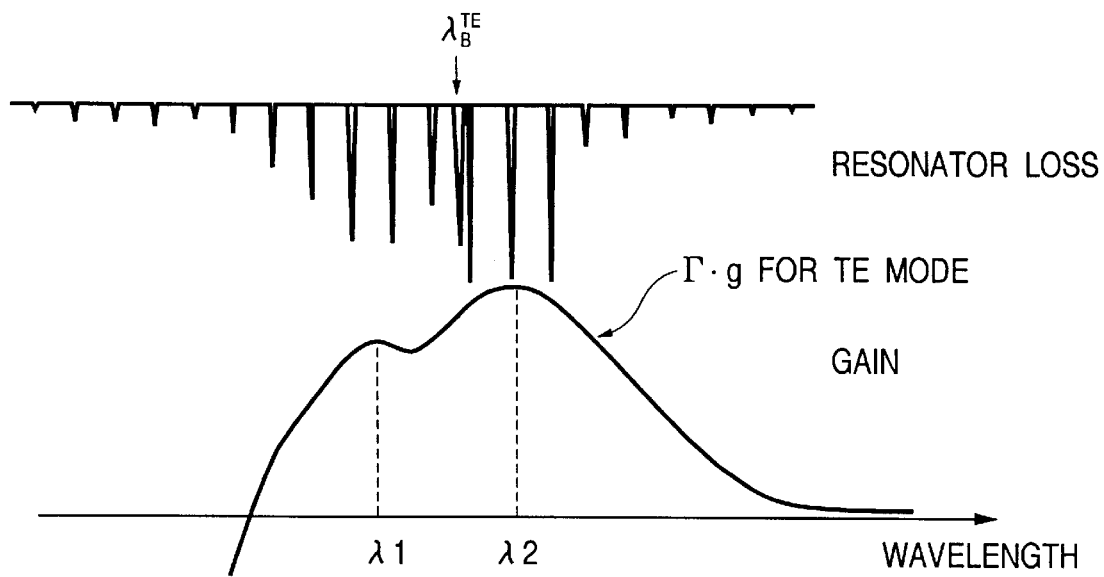
FIGS. 7A and 7B are graphs for explaining the relationship between the resonator loss spectrum and gain spectrum when the asymmetrical strained quantum well is used.
Figure 7B:
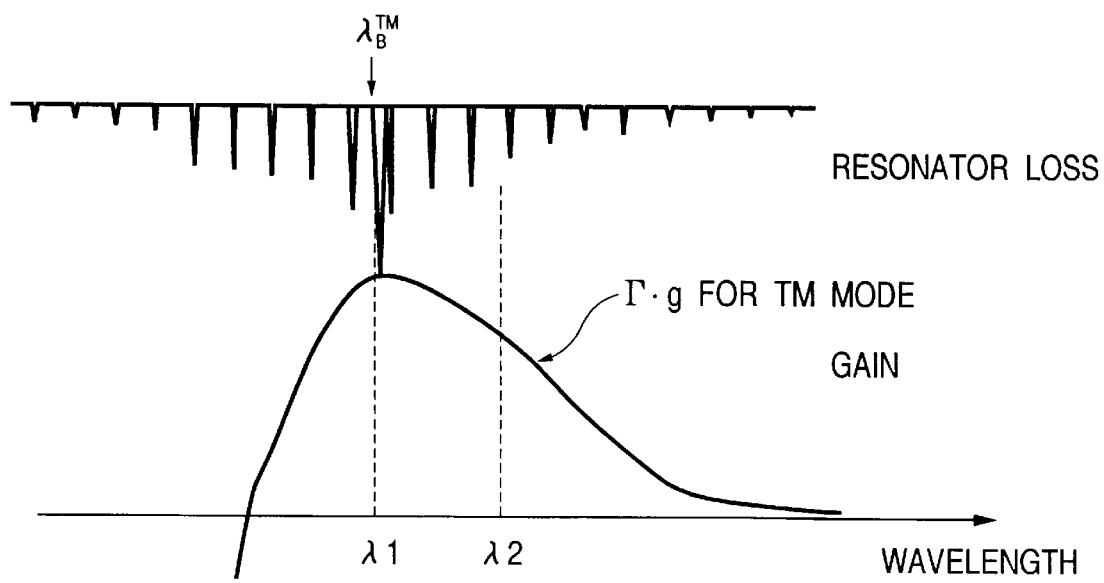

FIGS. 7A and 7B show the relationship between the $\Gamma$·g (gain×confinement coefficient) and the resonator loss viewed from an arbitrary one point in a state wherein carriers are injected in the vicinity of the threshold value of this embodiment in correspondence with TE and TM modes. This embodiment has a merit of optimizing the gain profiles of TM and TE modes. The operation principle is substantially the same as that described above with the aid of FIGS. 3A, 3B and 4 in the first embodiment.

In this embodiment, a tensile strain is introduced into only the quantum well on the high energy side. Alternatively, a compression strain may be introduced into only the quantum well on the low energy side, or a tensile strain and a compression strain may be respectively introduced into high- and low-energy quantum wells. Since a two-layered quantum well may pose a problem of saturation of the gain, an asymmetric stacked strained quantum well layer may be formed by stacking a plurality of active layers.

Fourth Embodiment

Figure 8:
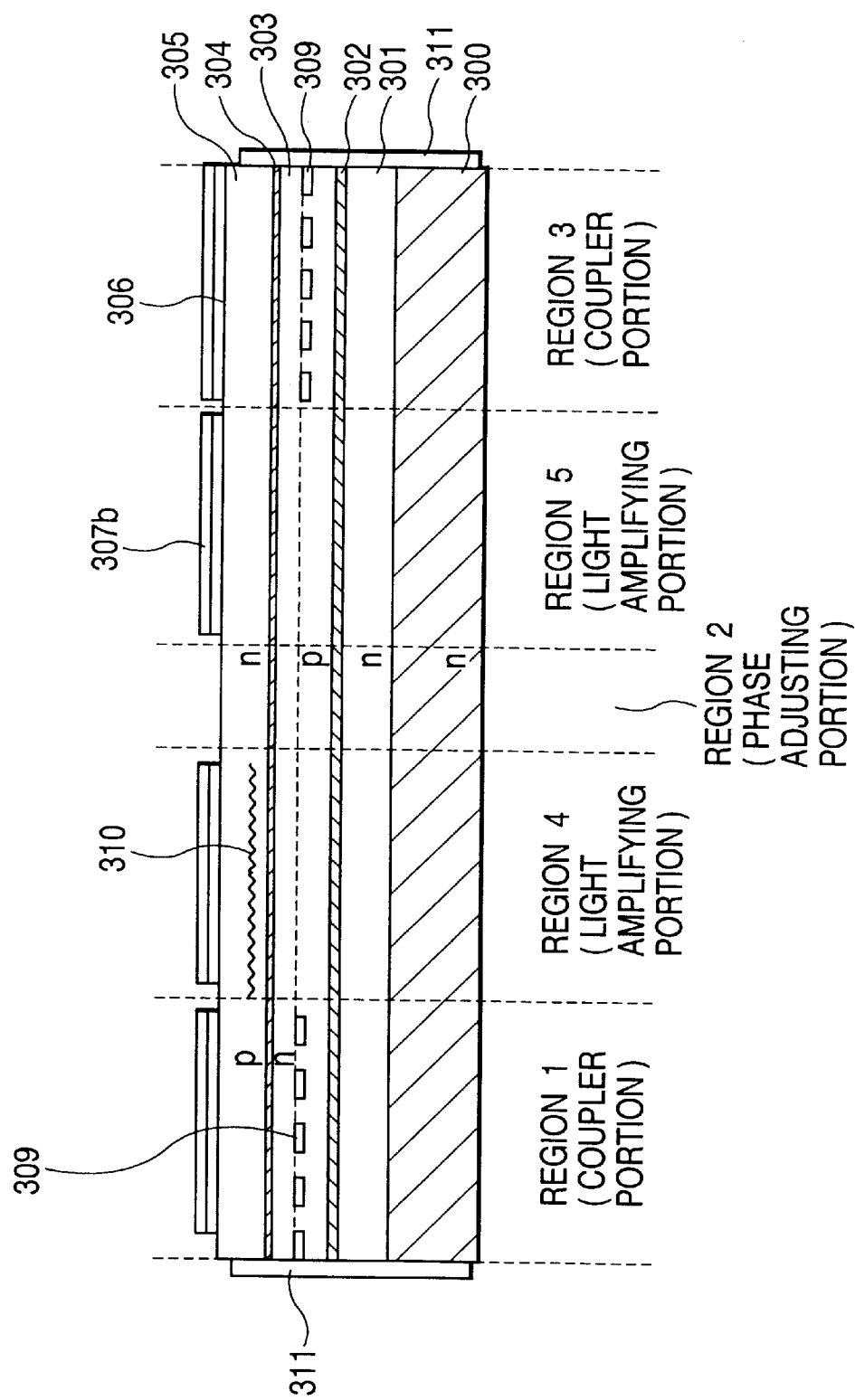
FIG. 8 is a sectional view of the fourth embodiment taken along the resonator direction.
Figure 9:
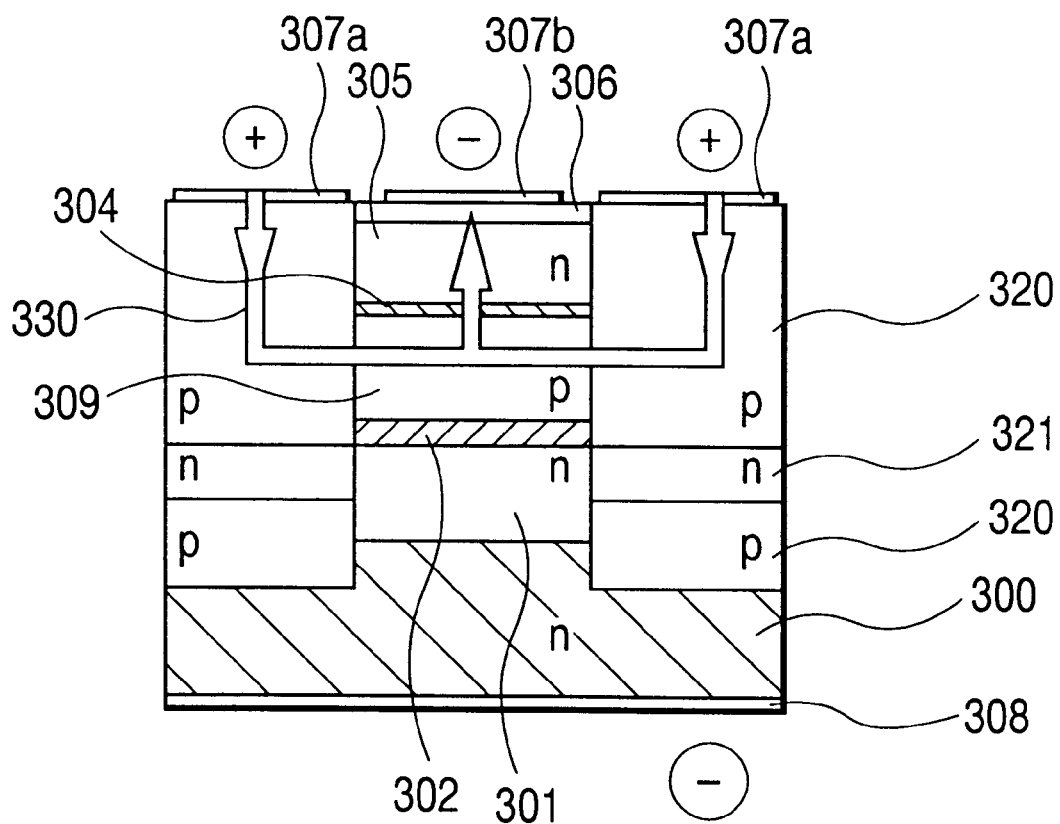
FIG. 9 is a sectional view of the fourth embodiment taken along the widthwise direction.

In order to control the resonator loss spectrum, it is effective to introduce a variable dividing ratio optical coupler in a compound resonator. As a variable dividing ratio mechanism suitable for the present invention, mechanisms described in Japanese Patent Application Nos. 5-80170 and 5-352709 filed by the present applicant are known. In this embodiment, such variable dividing ratio mechanism is applied to the second embodiment. FIG. 8 is a sectional view of the optical device taken along the resonator direction, and FIG. 9 is a sectional view of the device taken along a direction perpendicular to the resonator direction. Since the dividing/multiplexing ratios can be controlled by coupler portions in regions 1 and 3, the control range of the resonator loss spectrum can be broadened. That is, the polarized wave modulation range can be broadened (the current, applied voltage, and the like of each region need be adjusted as a preprocess of polarized wave modulation, but the adjustment range can be broadened).

In FIG. 8, five regions are connected in series in the direction in which light propagates. Regions 1 and 3 correspond to optical coupler portions, regions 4 and 5 correspond to light amplifying portions, and region 2 corresponds to a phase adjusting portion. For example, the optical device shown in FIG. 8 comprises an n-GaAs substrate 300, an n-AlGaAs first cladding layer 301, an n-AlGaAs first core layer 302, a p-AlGaAs second cladding layer 303, an undoped AlGaAs second core layer 304, an n-AlGaAs third cladding layer 305, and a contact layer (GaAs) 306. Also, the optical device comprises a positive electrode 307a, negative electrode 307b and 308, and a periodic current confinement layer 309 for modulating the refractive index. Reflection coats 311 are formed on the end faces.

The manufacturing method of this embodiment will be briefly described below. For example, using conventional metal organic chemical vapor deposition (MOCVD) or molecular beam epitaxial growth (MBE), a first cladding layer 301 to the lower layer of a second cladding layer 303 are grown on an n-GaAs substrate 300. After the lower layer of the second cladding layer 303 is grown, an n-AlGaAs layer is formed, and a grating pattern with an appropriate pitch is formed by etching so that its depth reaches a p-AlGaAs layer (the lower layer of the second cladding layer 303). Subsequently, the upper layer of a p-AlGaAs layer 303 is grown by MOCVD. As a result, a periodic current confinement layer 309 is formed. Thereafter, an undoped AlGaAs second core layer 304 and the lower layer of a third cladding layer 305 are grown, and a grating 310 in region 4 is formed. The upper layer of the third cladding layer 305 and a contact layer 306 are grown. In order to control the transverse mode, a buried structure or the like is formed, and electrodes 307a, 307b, and 308 are formed, thus completing the structure of this embodiment.

In the cross-sectional view in FIG. 9, the optical device has a p-AlGaAs buried layer 320, an n-buried layer 321, and a current path 330 between the positive and negative electrodes 307a and 307b.

The operation principle of this embodiment will be explained below. For example, when carriers are injected into regions 1 and 3 (between the positive and negative electrodes 307a and 308), the carrier distribution is modulated by the periodic current confinement layer 309 to form a carrier distribution in the first core layer 302, thus forming an equivalent refractive index distribution corresponding to the carrier distribution. Hence, light guided by two waveguides having, as centers, the first and second core layers 302 and 304 are coupled by the periodic current confinement layer 309. The degree of coupling can be controlled by the carrier injection state into regions 1 and 3. This corresponds to the control of the coupling coefficient between the waveguide of a DFB resonator region and that of a Fabry-Pérot resonator region. Hence, in cooperation with the current injection (the current path 330 between the positive and negative electrodes 307a and 307b) control in regions 2, 4, and 5, TE and TM modes can be selectively oscillated by the same operation principle as in the above embodiment. An optical coupler portion may be formed in one region.

In the first to fourth embodiments described above, phase adjusting control, and coupling control between the DFB region and the Fabry-Pérot region are made.

The above embodiments can be summarized as follows. FIGS. 3A and 3B show the relationship between the Γ·g (gain×confinement coefficient) spectrum and the resonator loss spectrum viewed from an arbitrary one point in a state wherein carriers are injected and excited in the vicinity of the threshold value of this embodiment in correspondence with TE and TM modes. In the above embodiments, since the active layer 104 uses a bulk structure without any quantum effect, the TE and TM modes have nearly no difference between their values of Γ·g (gain×confinement coefficient) profiles although they have a difference between their confinement coefficients Γ. As for the resonator loss, as the TE mode, since the axial mode suppression ratio becomes small, some axial modes that can oscillate are always present (see FIG. 3B) in cooperation with the broad gain spectrum of the TE mode. On the other hand, as the TM mode, since the axial mode suppression ratio becomes large, a Bragg wavelength $\lambda^{TM}_B$ can always be selected as an oscillation mode (FIG. 3A).

Hence, by controlling the carrier injection amount to the individual regions, not only the threshold gains of the two modes can be set to be equal to each other, and the oscillation mode can be switched between a stable TM mode and a TE multimode. Whether the entire LD oscillates in the TE mode or TM mode is determined by the phase condition. In the phase adjusting region, the effective refractive index is changed by a plasma effect by injecting carriers.

The embodiments to be described below will present the arrangements and methods for switching the oscillation state not by the control in the phase adjusting region but by another control.

Fifth Embodiment

Figure 13:
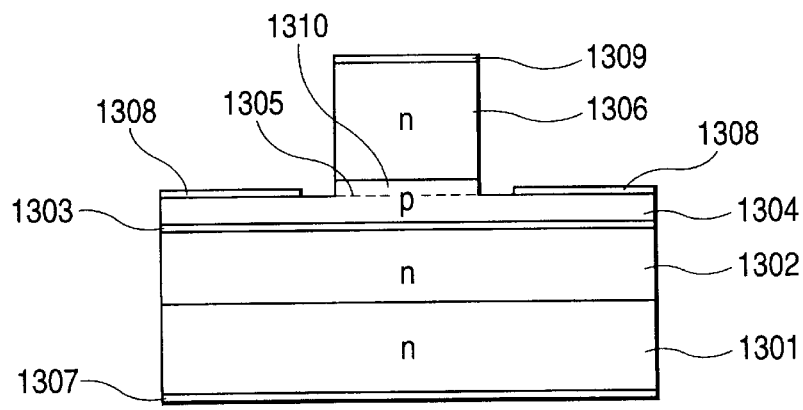
FIG. 13 is a sectional view showing the arrangement of the fifth embodiment of the present invention taken along a direction perpendicular to the resonance direction.
Figure 14:
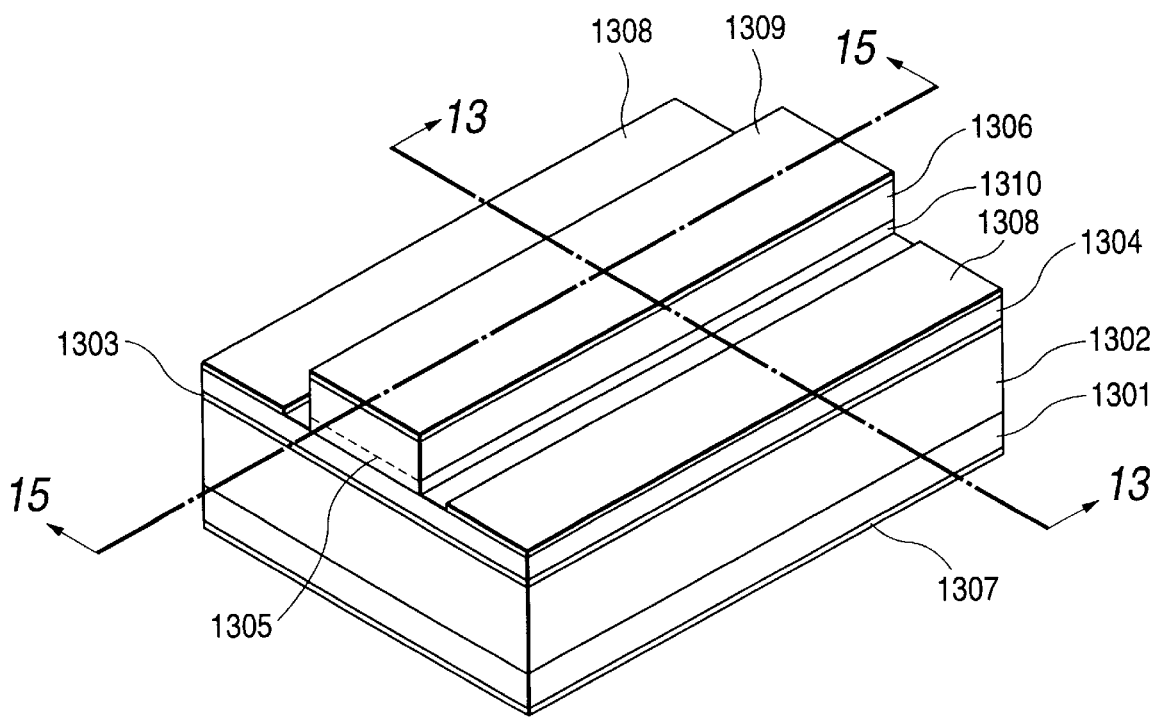
FIG. 14 is a perspective view of a device of the fifth embodiment of the present invention.

FIG. 13 best illustrates the characteristic feature of this embodiment as a distributed feedback semiconductor laser and shows a section taken along a line 13—13 (a direction perpendicular to the resonance direction) in FIG. 14. In FIG. 13, the device comprises an n-InP substrate 1301, an n-InP first cladding layer 1302, an active layer 1303 made up of a quantum well, a p-InGaAsP first light guide layer 1304, a diffraction grating 1305, a second light guide layer 1310 made up of, e.g., a quantum well, an n-InP second cladding layer 1306, a first electrode 1307 formed on the substrate 1301, a second electrode 1308 formed on a portion on the first light guide layer 1304, and a third electrode 1309 formed on the second cladding layer 1306.

Figure 15:
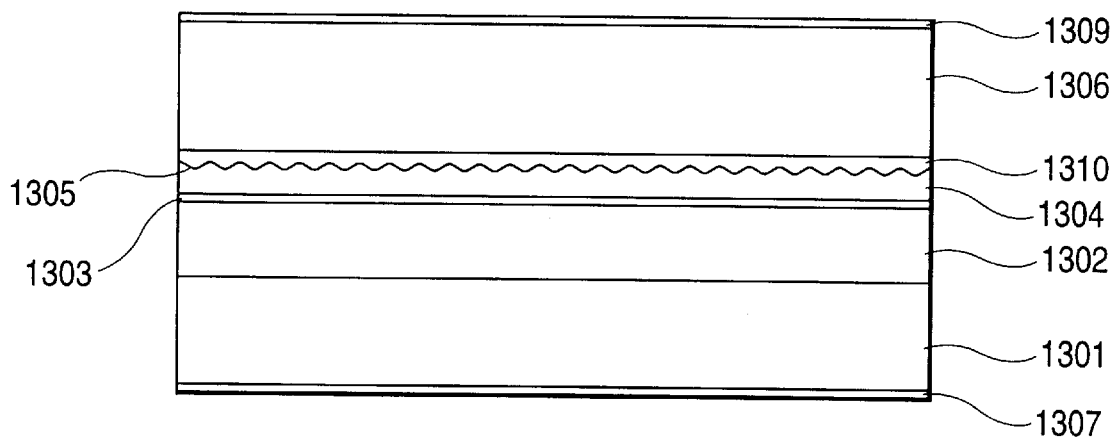
FIG. 15 is a sectional view showing the arrangement of the fifth embodiment of the present invention taken along the resonance direction.

FIG. 15 is a sectional view taken along a line 15—15 (the resonance direction) in FIG. 14. In FIG. 15, the two end faces are cleavage surfaces and build a Fabry-Pérot resonator. In FIGS. 13, 14, and 15, the same reference numerals denote the same members.

The dimensions and the like of principal part of the elements used in this embodiment are as follows. The active layer 1303 has a quantum well structure (five wells), in which the well portion consists of, e.g., undoped InGaAsP (thickness=11 nm) and the barrier portion consists of, e.g., undoped InGaAsP (thickness 20 nm) having a bandgap energy of 1.07 eV. The first light guide layer 1304 consists of, e.g., p-InGaAsP (bandgap energy=1.07 eV) and has a thickness of 0.2 μm and a p-doping amount of $5 \times 10^{17}$ cm$^{-3}$. The second light guide layer 1310 has a quantum well structure (10 wells), in which the well portion consists of, e.g., undoped InGaAsP (bandgap energy=0.95 eV; thickness=6 nm), and the barrier layer consists of undoped InP (thickness=10 nm).

As can be seen from FIGS. 13 and 14, the device of this embodiment adopts a ridge waveguide, which has a width of about 3 μm and an element length of about 500 μm. The diffraction grating 1305 is formed to have a period of 230 nm and a depth of about 30 nm. In this manner, the Bragg wavelength of the diffraction grating 1305 with respect to a TE polarized wave is set at the gain peak wavelength in cooperation with the arrangement of the active layer 1303. In FIGS. 13 to 15, no heavily doped layer for improving contacts is illustrated between the second electrode 1308 and the first light guide layer 1304, but such heavily doped layer is used for decreasing the contact resistance.

The active layer 1303 has a so-called tensilely strained quantum well structure using a material (InGaAsP) with a smaller lattice constant than that of the substrate 1301, and in the quantum level formed in the valence band, the level of light holes is the lowest-order level. Hence, carriers injected by current injection are trapped by the quantum levels of the conduction band and the levels of these light holes to form an inverted distribution, thus causing spontaneous emission and stimulated emission. In this manner, the gain for a TM polarized wave is set to be larger than that for a TE polarized wave.

The second light guide layer 1310 has a quantum well structure that does not serve as an absorption layer with respect to light produced by the active layer 1303, and its refractive index changes (increases) by applying a reverse bias. The reverse bias is applied to the second light guide layer 1310 via the second and third electrodes 1308 and 1309.

The operation of this embodiment will be explained below. In this case, the second electrode 1308 serves as a common electrode, i.e., operates while being grounded. Current injection into the active layer 1303 is performed by applying a forward bias voltage using the first and second electrodes 1307 and 1308. On the other hand, a reverse bias voltage is applied to the second light guide layer 1310 that forms the diffraction grating 1305 using the second and third electrodes 1308 and 1309 to cause a quantum confinement Stark effect in the quantum wells that build the second light guide layer 1310, thereby changing the refractive index.

Oscillation of a DFB mode will be explained below. Currents are injected into the active layer 1303 while no voltage is applied to the second light guide layer 1310. Since this state is equivalent to that of a normal single-electrode distributed feedback semiconductor laser, when a predetermined threshold value has been reached, the DFB mode is oscillated as a TE polarized wave. In this DFB mode oscillation state, a reverse bias voltage is applied to the second light guide layer 1310 to change the refractive index of the second light guide layer 1310 that forms the diffraction grating 1305. Owing to the quantum confinement Stark effect, the refractive index increases slightly, and the refractive index difference between the materials that sandwich the diffraction grating 1305 therebetween, i.e., between the first and second light guide layers 1304 and 1310 decreases. Hence, the coupling coefficient of the diffraction grating 1305 decreases. The decrease in coupling coefficient stops the oscillation in the DFB mode that has taken place before voltage application, and causes switching to an FP mode oscillation that resonates between the two end faces. The FP mode oscillation becomes TM polarized wave oscillation since the active layer 1303 has the tensilely strained quantum well structure. By decreasing the applied voltage from this FP mode oscillation state, the coupling coefficient of the diffraction grating 1305 can be increased, and the oscillation mode can be switched from the FP mode to the DFB mode again. Whether the DFB mode and FP mode correspond to TE polarized wave oscillation or TM polarized wave oscillation can be appropriately set in design of the arrangement of the active layer, the pitch of the diffraction grating, and the like.

In this embodiment, a voltage is applied to the diffraction grating 1303, which has κL (the product of the coupling coefficient of the diffraction grating 1305 and the resonator length) of about 1.2 (about 70% as a reflectance), while no reverse bias is applied to the diffraction grating 1305, so as to decrease the refractive index difference between the first and second light guide layers 1304 and 1310, thereby halving θL. In this manner, the reflectance at the end face relatively becomes large, and the FP mode becomes predominant.

In this embodiment, as the active layer in which TE and TM polarized waves have nearly equal gains, a tensilely strained quantum well structure is used. However, the present invention is not limited to this, and an active layer having a bulk structure may be used. Also, the means for changing the refractive index of the guide layer is not limited to voltage application, but may use a plasma effect by current injection, and the like. In the above-mentioned arrangement, a forward bias voltage may be applied to the second light guide layer 1310 using the second and third electrodes 1308 and 1309 to attain current injection.

Figure 16:
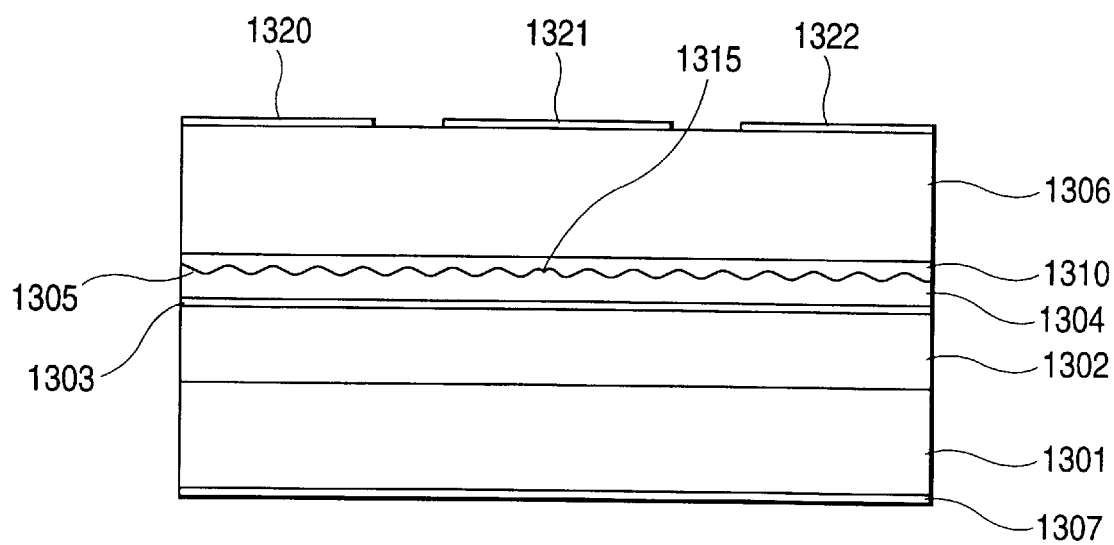
FIG. 16 is a sectional view showing the arrangement taken along the resonance direction when a $\lambda/4$ shift is introduced into the fifth embodiment of the present invention.

In the case of this embodiment, since the DFB mode (a mode determined by feedback of the diffraction grating 1305) is readily influenced by end face reflections, a phase discontinuous portion (e.g., a λ/4 phase shift portion 1315) is preferably formed in the diffraction grating 1305 to stabilize the DFB mode (such means is the same as that in a conventional DFB laser; FIG. 16 shows the sectional arrangement in the resonance direction). In the arrangement shown in FIG. 16, three electrodes 1320, 1321, and 1322 are formed, and are used for current control for varying the wavelength, adjusting the phase, and so on.

This embodiment adopts the DFB laser arrangement, but may adopt a DBR laser arrangement in which an active region which has the active layer 1303 and a flat light guide layer and has no diffraction grating 1305, and a DBR region which has an electrode 1309 for applying a voltage to the diffraction grating 1305 between the first and second light guide layers 1304 and 1310, and the second light guide layer 1310, are formed in series in the resonance direction. The operation of the DBR laser is substantially the same as that of the above-mentioned DFB laser. That is, current injection into the active layer 1303 in the active region is attained by applying a forward bias voltage using the first and second electrodes 1307 and 1308, while a reverse bias voltage is applied to the second light guide layer 1310 that forms the diffraction grating 1305 in the DBR region using the second and third electrodes 1308 and 1309 to cause the quantum confinement Stark effect, thereby changing the refractive index.

Sixth Embodiment

Figure 17:
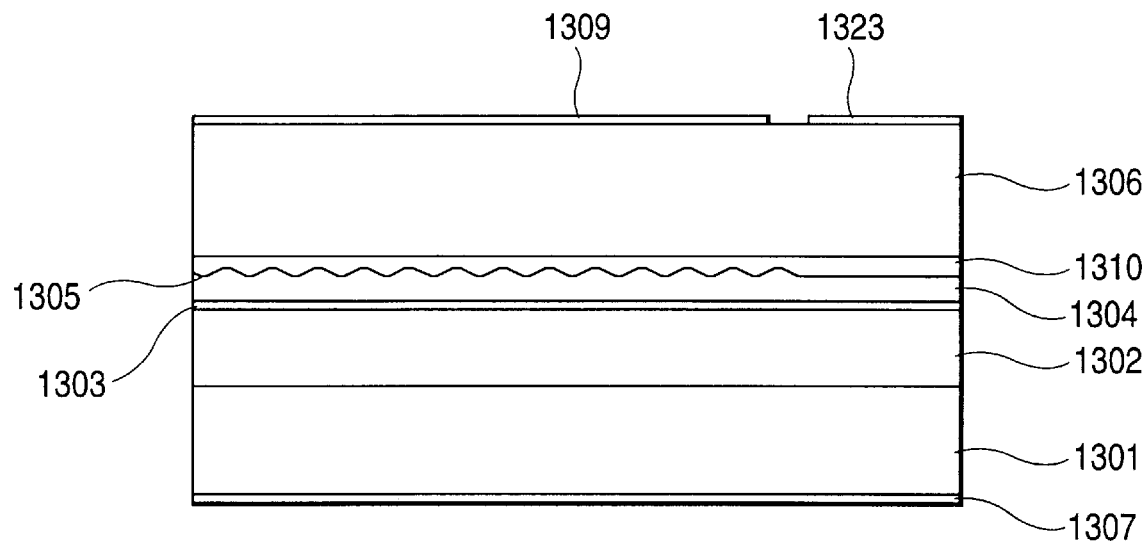
FIG. 17 is a sectional view showing the arrangement of the sixth embodiment of the present invention taken along the resonance direction.

FIG. 17 shows the sixth embodiment of the present invention. FIG. 17 corresponds to FIG. 15 of the fifth embodiment. The same reference numerals in FIG. 17 denote the same parts as in the fifth embodiment. The section perpendicular to the resonance direction is the same as that shown in FIG. 13 in a region with the diffraction grating 1305.

The difference between the sixth and fifth embodiments is that a portion where no diffraction grating is formed is present on the right side in FIG. 17. If the depth of the diffraction grating 1305 is set to be the same as that in the fifth embodiment, and also the element length remains the same, the parameter θL that influences reflections by the diffraction grating decreases. In the sixth embodiment, the length of a portion where the diffraction grating 1305 is formed is reduced to about 80% of the fifth embodiment. With this structure, although the threshold value for an oscillation in the DFB mode is raised slightly, the coupling coefficient of the diffraction grating 1305 need only be decreased by a smaller amount upon switching to the FP mode. Hence, the voltages to be applied across the electrodes 1308 and 1309, and electrodes 1307 and 1323 can be lowered upon switching to the FP mode. Upon switching to the FP mode, currents (injection currents into the active layer 1303) across the electrodes 1307 and 1308 are preferably increased.

Seventh Embodiment

Figure 18:
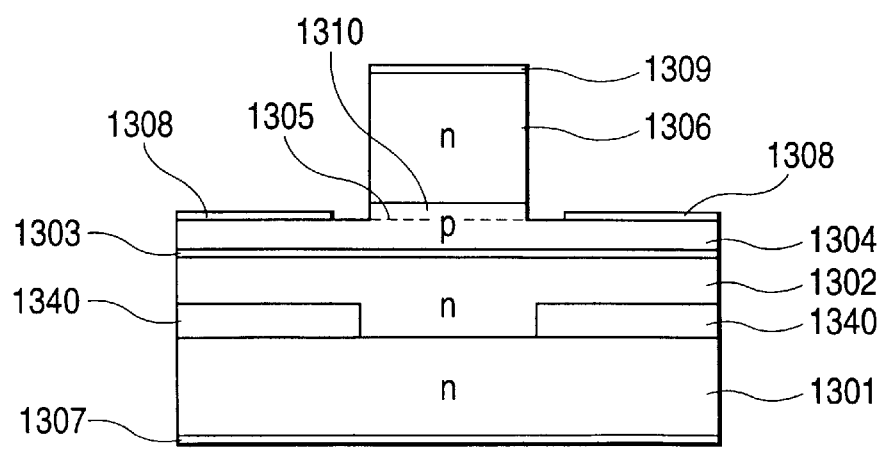
FIG. 18 is a sectional view showing an example in which a current confinement structure is added to the arrangement of the fifth embodiment.

In this embodiment, upon injecting currents into the active layer 1303 using the first and second electrodes 1307 and 1308, current injection is limited to only an active layer portion below a ridge, so that no currents are injected into the portion of the active layer 1303 where no light is guided, thereby decreasing the threshold value and stabilizing the guided mode. FIG. 18 corresponds to FIG. 13 of the fifth embodiment. The same reference numerals in FIG. 18 denote the same parts as in FIG. 13. A new member in FIG. 18 is a current confinement layer 1340. The current confinement layer 1340 consists of, e.g., p-InP (thickness=1 μm; p-doping amount=5×10$^{17}$ cm$^{-3}$), and is not formed in a portion below the ridge. With this current confinement layer 1340, currents to be injected into the active layer 1303 using the first and second electrodes 1307 and 1308 cannot flow through the portion of the current confinement layer 1340, and are limited to the portion below the ridge of the active layer 1303. As a result, invalid currents can be reduced, and the guided mode can be stabilized.

Eighth Embodiment

Figure 19:
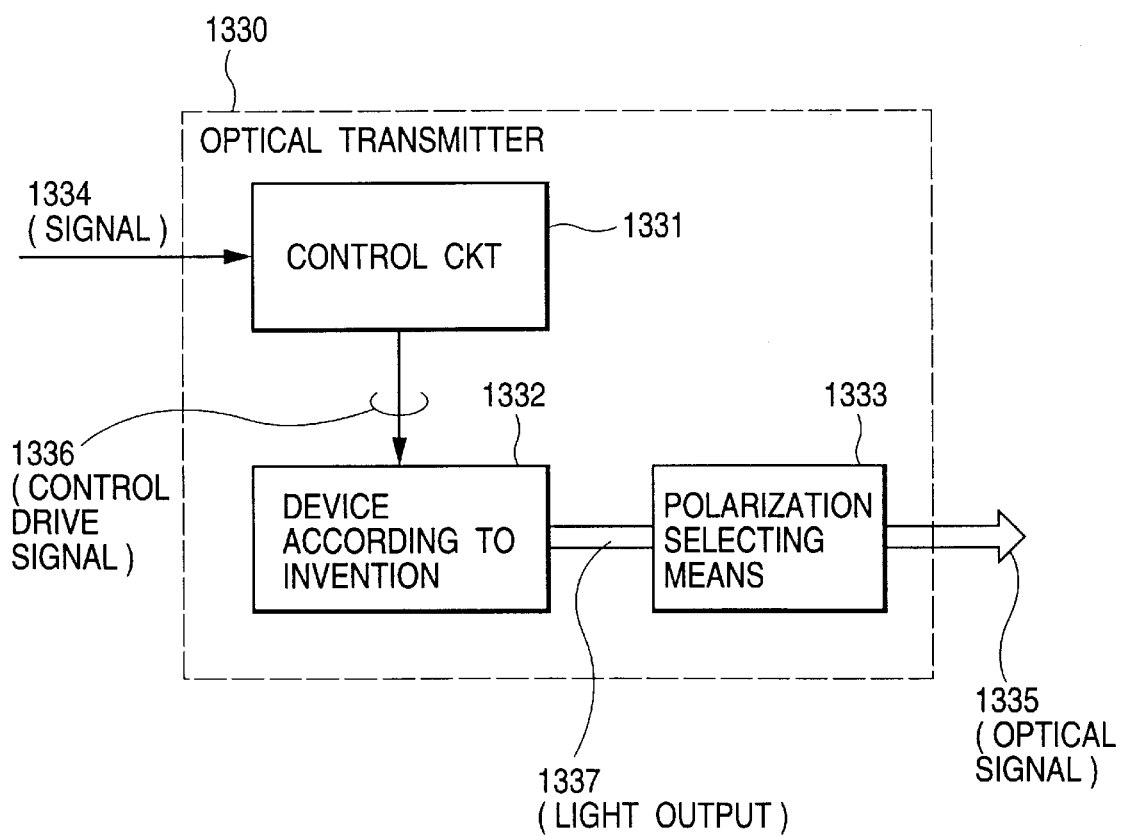
FIG. 19 is a diagram showing the arrangement of an optical transmitter using a device of the present invention.

FIG. 19 shows an embodiment when the element described in each of the first to seventh embodiments is used in an optical transmitter. FIG. 19 illustrates an optical transmitter 1330, a control circuit 1331, a device 1332 according to the present invention, a polarization selecting means (e.g., a polarizer) 1333, a signal 1334 to be transmitted, an optical signal 1335 output from the optical transmitter 1330, a signal 1336 which is output from the control circuit 1331 to control driving of the device 1332 of the present invention, and a light output 1337 output from the device 1332 of the present invention.

The operation of this arrangement will be briefly described below. The optical transmitter 1330 that received a signal 1334 to be transmitted from an external device generates a control drive signal 1336 for driving the device 1332 of the present invention on the basis of the principle described so far in the above embodiments. Upon reception of the control drive signal 1336, the device 1332 of the present invention switches the light output state between a DFB mode as a TE polarized wave (or a DFB mode as a TM polarized wave) and an FP mode as a TM polarized wave (or a FP mode as a TE polarized wave). The obtained light output 1337 is input to the polarization selecting means 1333 to select a light output of one polarization state (e.g., light of the DFB mode as the TE polarized wave), thus obtaining an optical signal 1335 corresponding to the signal 1334. In this case, the mode of light can be appropriately selected in correspondence with situations.

Ninth Embodiment

Figure 10:
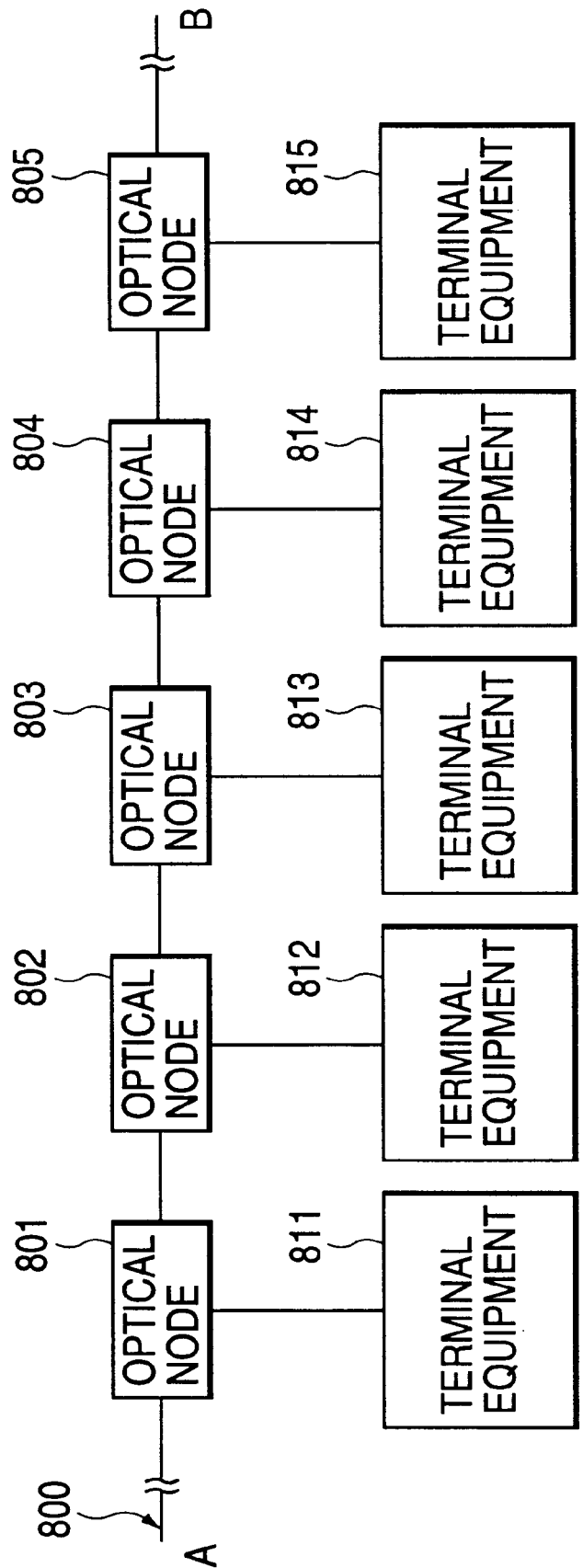
FIG. 10 is a diagram showing an example when a semiconductor optical device of the present invention is applied to an optical network.
Figure 11:
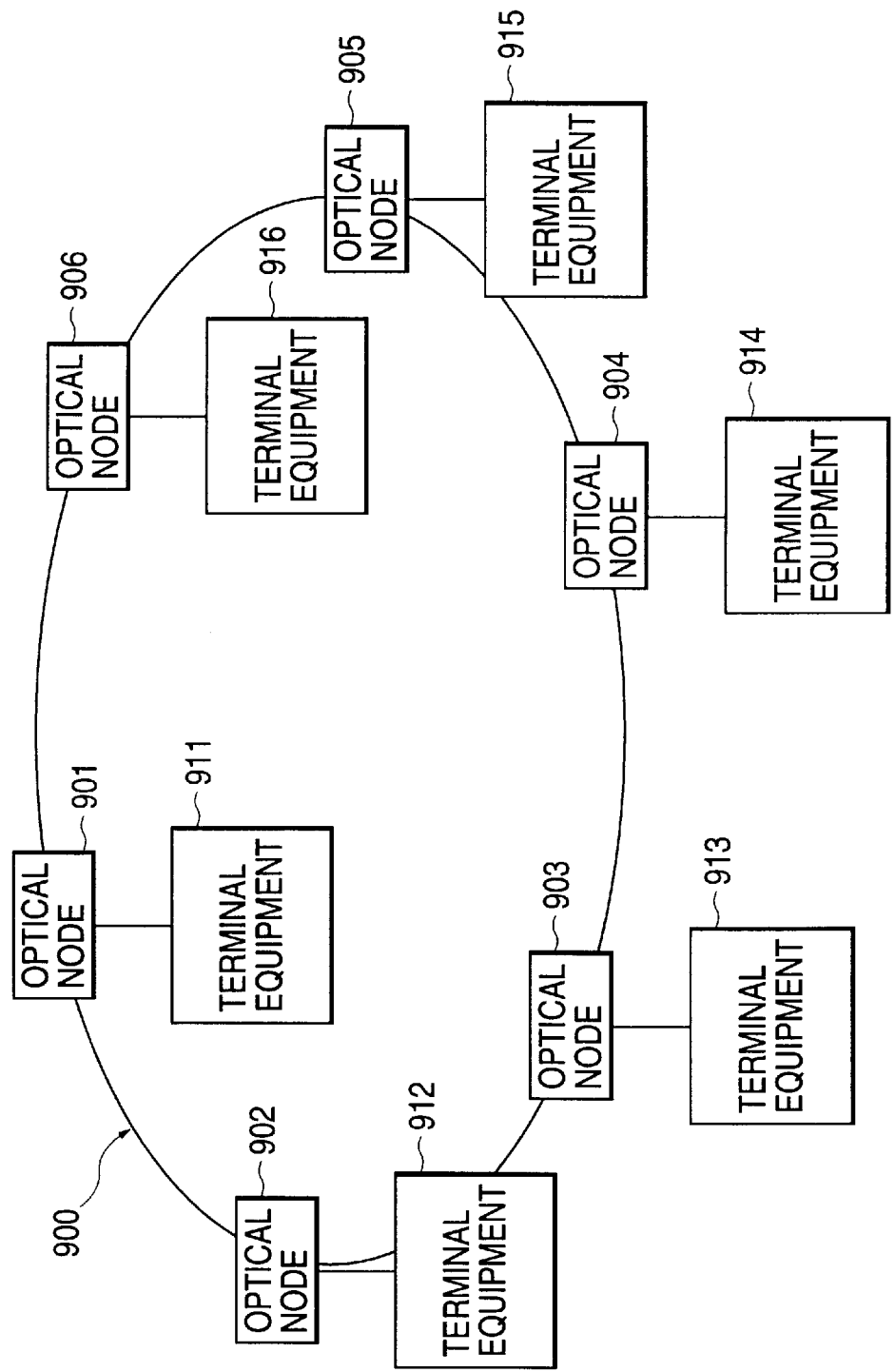
FIG. 11 is a diagram showing another example when a semiconductor optical device of the present invention is applied to an optical network.
Figure 12:
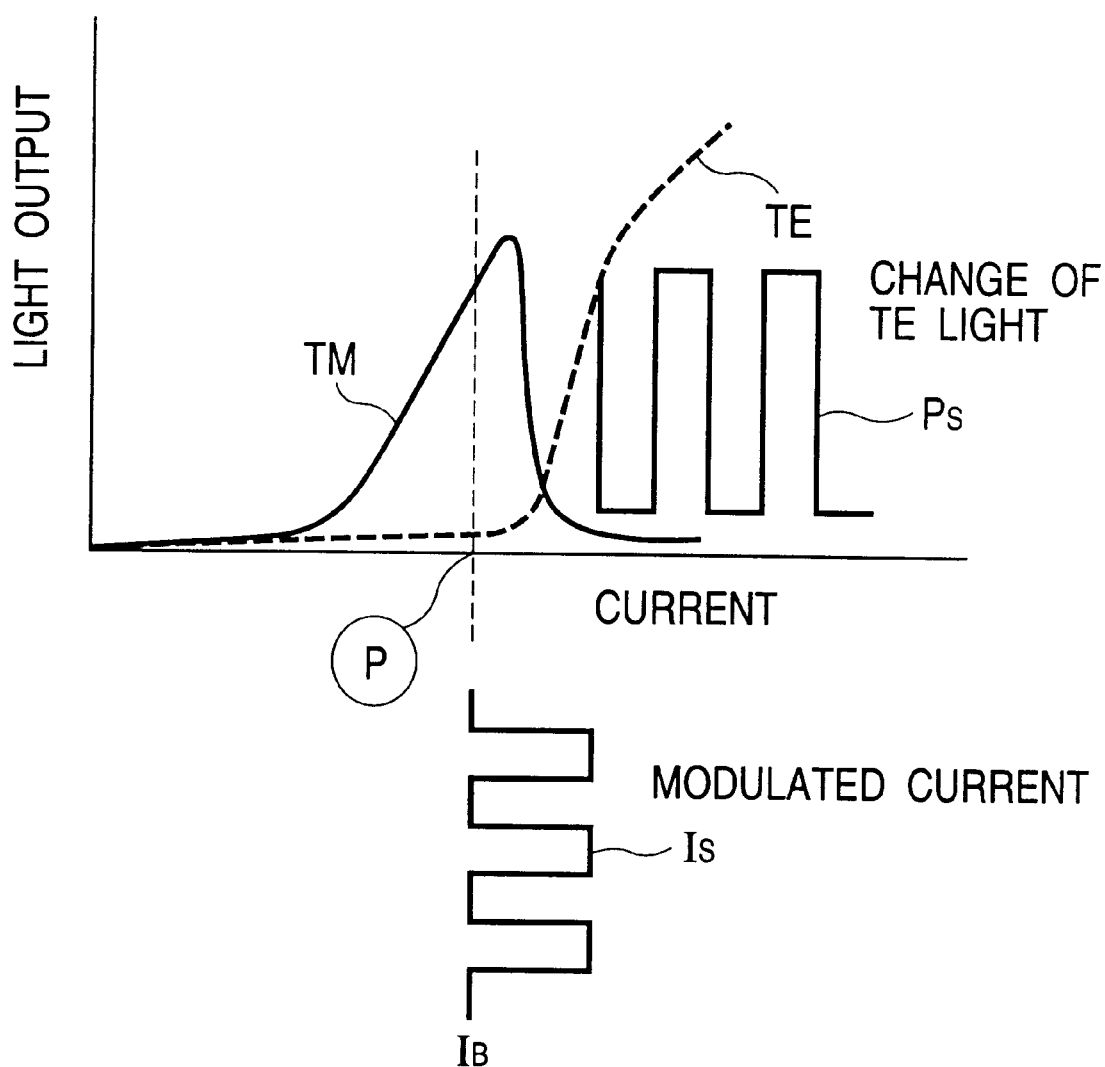
FIG. 12 is a graph for explaining the prior art.
Figure 20:
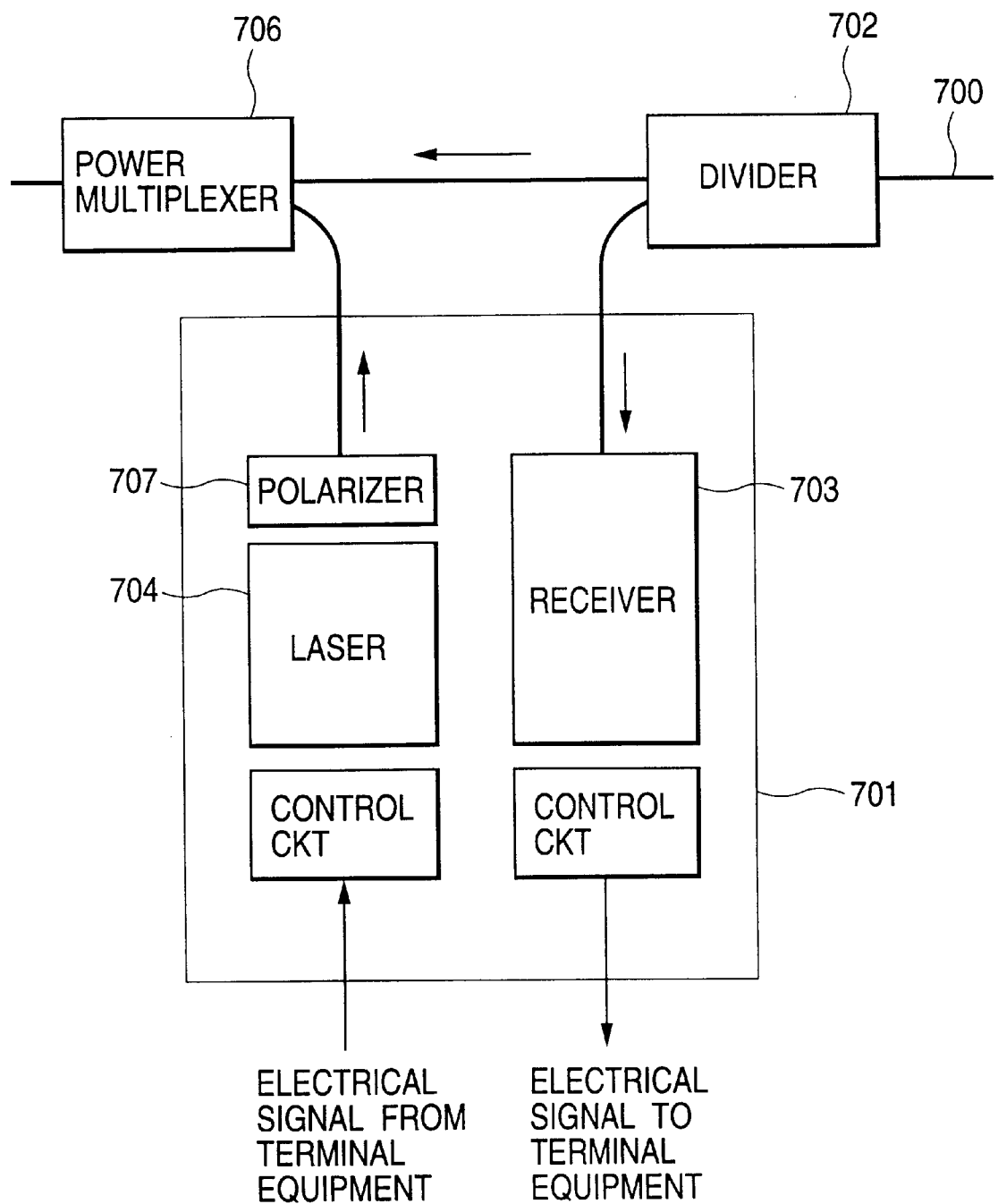
FIG. 20 is a diagram showing the arrangement of a node using a device of the present invention.

FIG. 20 shows the arrangement of an opto-electric conversion unit (node) connected to terminal equipments when a semiconductor device according to the present invention is applied to a wavelength multiplexing optical LAN system, and FIGS. 10 and 11 show the arrangements of optical LAN systems using such node 701.

An optical signal transmitted via an optical fiber 700 as a medium connected to an external device is received by a node 701, and some signal components are input to a receiver 703 comprising, e.g., a variable wavelength optical filter, and the like via a divider 702. The receiver 703 extracts only an optical signal of a desired wavelength and performs signal detection. The detected signal is processed by a control circuit by an appropriate method, and the processed signal is sent to a terminal equipment. On the other hand, when an optical signal is transmitted from the node 701, a polarized wave modulation semiconductor laser 704 of each of the above embodiments is driven by a control circuit in accordance with an appropriate method, as described above, to polarized wave-modulate the optical signal. The modulated optical signal is input to a polarizer 707 (to convert the polarized wave-modulated signal into an amplitude/intensity-modulated signal), and output light is transmitted onto an optical transmission path via a power multiplexer 706 (an isolator may be further inserted). A plurality of sets of semiconductor lasers and variable wavelength optical filters may be arranged to broaden the variable wavelength range.

The optical LAN system shown in FIG. 10 adopts a bus type network, in which nodes 801 to 805 are connected in directions A and B, and a large number of terminal equipments and centers 811 to 815 can be connected via the network. In order to connect a large number of nodes, light amplifiers must be serially arranged on a transmission path 800 to compensate for attenuation of light. Two out of the nodes 801 to 805 may be connected to each of the terminal equipments 811 to 815 to form two transmission paths, thus allowing two-way transmissions based on a DQDB scheme. Furthermore, as the network patterns, a loop type that connects A and B in FIG. 10 (shown in FIG. 11), a star type, a combination of these types, and the like are available.

The system shown in FIG. 11 includes an optical transmission path 900, optical nodes 901 to 906, and terminal equipments 911 to 914.

What is claimed is:

1. An optical device comprising:
a compound resonator structure having a first resonator structure which produces resonance by reflecting light using a diffraction grating, and a second resonator structure which produces Fabry-Pérot resonance by reflecting light using at least two surfaces, wherein an output intensity of light of a predetermined polarized wave in a first oscillation state mainly based on the resonance by said first resonator structure is different from an output intensity of light of the predetermined polarized wave in a second oscillation state mainly based on the resonance by said second resonator structure.

2. A device according to claim 1, wherein a first region including said first resonator structure and a second region including said second resonator structure are serially formed.

3. A device according to claim 1, wherein at least portions of a first region including said first resonator structure and a second region including said second resonator structure overlap each other.

4. A device according to claim 1, further comprising control means for switching an oscillation state between the first and second oscillation states.

5. A device according to claim 1, further comprising control means for applying electrical control for switching an oscillation state between the first and second oscillation states.

6. A device according to claim 1, further comprising an electrode for applying electrical control for switching an oscillation state between the first and second oscillation states.

7. A device according to claim 1, further comprising an electrode for switching an oscillation state between the first and second oscillation states by controlling a carrier density to be injected.

8. A device according to claim 1, further comprising an electrode for switching an oscillation state between the first and second oscillation states by controlling an electric field to be applied.

9. A device according to claim 1, further comprising a phase adjusting region for adjusting a phase of light in said optical device.

10. A device according to claim 1, further comprising a phase adjusting region for adjusting a phase of light in said optical device independently of a first region including said first resonator structure and a second region including said second resonator structure.

11. A device according to claim 1, wherein the diffraction grating is formed on an interface between two semiconductor layers.

12. A device according to claim 1, wherein the diffraction grating is formed on an interface between two semiconductor layers, and said optical device further comprises means for adjusting a refractive index of at least one of the two semiconductor layers.

13. A device according to claim 1, wherein the diffraction grating is formed on an interface between two semiconductor layers, and at least one of the two semiconductor layers includes a quantum well structure.

14. A device according to claim 1, wherein the diffraction grating is formed on an interface between two semiconductor layers, and said optical device further comprises control means for applying electrical control for adjusting a refractive index of at least one of the two semiconductor layers.

15. A device according to claim 1, wherein the diffraction grating is formed on an interface between two semiconductor layers, and said optical device further comprises an electrode for applying electrical control for adjusting a refractive index of at least one of the two semiconductor layers.

16. A device according to claim 1, wherein the diffraction grating is formed on an interface between two semiconductor layers, and said optical device further comprises an electrode for applying an electrical field for adjusting a refractive index of at least one of the two semiconductor layers.

17. A device according to claim 1, further comprising a gain medium for producing a gain in said optical device.

18. A device according to claim 1, further comprising an active layer including a gain medium for producing a gain in said optical device, said active layer including a quantum well structure.

19. A device according to claim 18, wherein said active layer includes a plurality of quantum well structures.

20. A device according to claim 19, wherein the plurality of quantum well structures are at least partially different from each other to build an asymmetric quantum well structure.

21. A device according to claim 18, wherein a strain stress is applied on at least one of layers that build the quantum well structure.

22. A device according to claim 1, further comprising a gain medium for producing a gain in said optical device, a Bragg wavelength of the diffraction grating being set in the vicinity of peak energy of said gain medium.

23. A device according to claim 1, further comprising an electrode for independently injecting carriers into a first region including said first resonator structure and a second region including said second resonator structure.

24. A device according to claim 1, wherein an axial mode spacing of the Fabry-Pérot resonance is set to be sufficiently smaller than a stop band based on the resonance by the diffraction grating in a region including the diffraction grating.

25. A device according to claim 1, further comprising means for controlling a degree of optical coupling between said first and second resonator structures.

26. A device according to claim 1, further comprising a region for controlling a degree of optical coupling between said first and second resonator structures.

27. A device according to claim 1, wherein the diffraction grating has a phase discontinuous portion.

28. A device according to claim 1, further comprising a region where the diffraction grating is not formed.

29. An optical device comprising:
a compound resonator structure having a first resonator structure which produces resonance by reflecting light using a diffraction grating, and a second resonator structure which produces Fabry-Pérot resonance by reflecting light using at least two surfaces; and
means for switching an oscillation state between a first oscillation state mainly based on the resonance by said first resonator structure and a second oscillation state mainly based on the resonance by said second resonator structure.

30. An optical device comprising:
a compound resonator structure having a first resonator structure which produces resonance by reflecting light using a diffraction grating, and a second resonator structure which produces Fabry-Pérot resonance by reflecting light using at least two surfaces; and
an electrode for applying electrical control for switching an oscillation state between a first oscillation state mainly based on the resonance by said first resonator structure and a second oscillation state mainly based on the resonance by said second resonator structure.

31. An optical transmitter comprising:
an optical device for outputting light, said optical device comprising:
a compound resonator structure having a first resonator structure which produces resonance by reflecting light using a diffraction grating, and a second resonator structure which produces Fabry-Pérot resonance by reflecting light using at least two surfaces, wherein an output intensity of light of a predetermined polarized wave in a first oscillation state mainly based on the resonance by said first resonator structure is different from an output intensity of light of the predetermined polarized wave in a second oscillation state mainly based on the resonance by said second resonator structure; and
a polarized wave selector for extracting the light of the predetermined polarized wave from the output light from said optical device.

32. An optical transmitter comprising:
an optical device for outputting light, said optical device comprising:
a compound resonator structure having a first resonator structure which produces resonance by reflecting light using a diffraction grating, and a second resonator structure which produces Fabry-Pérot resonance by reflecting light using at least two surfaces; and
means for switching an oscillation state between a first oscillation state mainly based on the resonance by said first resonator structure and a second oscillation state mainly based on the resonance by said second resonator structure; and
a polarized wave selector for extracting the light of the predetermined polarized wave from the output light from said optical device.

33. An optical transmitter comprising:
an optical device for outputting light, said optical device comprising:
a compound resonator structure having a first resonator structure which produces resonance by reflecting light using a diffraction grating, and a second resonator structure which produces Fabry-Pérot resonance by reflecting light using at least two surfaces; and
an electrode for applying electrical control for switching an oscillation state between a first oscillation state mainly based on the resonance by said first resonator structure and a second oscillation state mainly based on the resonance by said second resonator structure; and
a polarized wave selector for extracting the light of the predetermined polarized wave from the output light from said optical device.

34. A network for transmitting an optical signal, comprising:
an optical transmitter comprising:
an optical device for outputting light, said optical device comprising:
a compound resonator structure having a first resonator structure which produces resonance by reflecting light using a diffraction grating, and a second resonator structure which produces Fabry-Pérot resonance by reflecting light using at least two surfaces, wherein an output intensity of light of a predetermined polarized wave in a first oscillation state mainly based on the resonance by said first resonator structure is different from an output intensity of light of the predetermined polarized wave in a second oscillation state mainly based on the resonance by said second resonator structure; and
a polarized wave selector for extracting the light of the predetermined polarized wave from the output light from said optical device; and
an optical receiver for receiving the light output from said optical transmitter.

35. A network for transmitting an optical signal, comprising:
an optical transmitter comprising:
an optical device for outputting light, said optical device comprising:

a compound resonator structure having a first resonator structure which produces resonance by reflecting light using a diffraction grating, and a second resonator structure which produces Fabry-Pérot resonance by reflecting light using at least two surfaces; and means for switching an oscillation state between a first oscillation state mainly based on the resonance by said first resonator structure and a second oscillation state mainly based on the resonance by said second resonator structure; and a polarized wave selector for extracting the light of the predetermined polarized wave from the output light from said optical device; and an optical receiver for receiving the light output from said optical transmitter.

36. A network for transmitting an optical signal, comprising:

an optical transmitter comprising:

an optical device for outputting light, said optical device comprising:

a compound resonator structure having a first resonator structure which produces resonance by reflecting light using a diffraction grating, and a second resonator structure which produces Fabry-Pérot resonance by reflecting light using at least two surfaces; and an electrode for applying electrical control for switching an oscillation state between a first oscillation state mainly based on the resonance by said first resonator structure and a second oscillation state mainly based on the resonance by said second resonator structure; and a polarized wave selector for extracting the light of the predetermined polarized wave from the output light from said optical device; and an optical receiver for receiving the light output from said optical transmitter.

37. A method of driving an optical device having a diffraction grating and at least two surfaces for reflecting light, comprising the step of:

switching an oscillation state between a first oscillation state to which resonance by reflection of light by the diffraction grating greatly contributes, and a second oscillation state in which a degree of contribution of the resonance by the reflection of light by the diffraction grating is smaller than the first oscillation state.

38. A method according to claim 37, wherein in the first oscillation state, an output intensity of light of a predetermined polarized wave is large, and in the second oscillation state, the output intensity of light of the predetermined polarized wave is smaller than the first oscillation state.

39. A method according to claim 37, wherein switching between the first and second oscillation states is attained by adjusting a phase of light in said optical device.

40. A method according to claim 37, wherein switching between the first and second oscillation states is attained by controlling a coupling coefficient of the diffraction grating.

* * * * *

UNITED STATES PATENT AND TRADEMARK OFFICE
CERTIFICATE OF CORRECTION

PATENT NO.    : 6,031,860
DATED         : February 29, 2000
INVENTOR(S)   : Jun Nitta et al.

It is certified that error appears in the above-identified patent and that said Letters Patent is hereby corrected as shown below:

<u>Title page,</u>
Item [75] Inventors, "Ninomiya-machi," should read -- Yamanishi --.
Item [56], References Cited, FOREIGN PATENT DOCUMENTS, "63299291" should read -- 63-299291 --.

<u>Column 11,</u>
Line 27, "$\lambda \cdot g$" should read -- $\Gamma \cdot g$ --.

<u>Column 15,</u>
Line 16, "halving" should read -- having --; and "$\theta L$" should read -- $_{K}L$ --.

<u>Column 16,</u>
Line 6, "$\theta L$" should read -- $_{K}L$ --.

Signed and Sealed this

Second Day of April, 2002

Attest:

*Attesting Officer*

JAMES E. ROGAN
*Director of the United States Patent and Trademark Office*